US012726557B2

(12) United States Patent
Kim et al.

(10) Patent No.: US 12,726,557 B2
(45) **Date of Patent: *Sep. 1, 2026**

(54) ELECTRONIC DEVICE INCLUDING DISPLAY AND A CUSHION MEMBER

(71) Applicant: Samsung Electronics Co., Ltd., Suwon-si (KR)

(72) Inventors: Dooryong Kim, Suwon-si (KR); Yunsik Kim, Suwon-si (KR); Jaemyung Cho, Suwon-si (KR); Jingook Kim, Suwon-si (KR); Yonghee Jang, Suwon-si (KR); Sinyoung Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 66 days.

This patent is subject to a terminal disclaimer.

(21) Appl. No.: 18/894,744

(22) Filed: Sep. 24, 2024

(65) Prior Publication Data

US 2025/0016937 A1 Jan. 9, 2025

Related U.S. Application Data

(63) Continuation of application No. 18/541,998, filed on Dec. 15, 2023, now Pat. No. 12,279,382, which is a (Continued)

(30) Foreign Application Priority Data

May 3, 2019 (KR) ........................ 10-2019-0052458

(51) Int. Cl.
*H05K 5/02* (2006.01)
*H04M 1/02* (2006.01)
(Continued)

(52) U.S. Cl.
CPC ....... *H04M 1/0216* (2013.01); *H04M 1/0268* (2013.01); *H04M 1/185* (2013.01); *H05K 5/0017* (2013.01); *H05K 5/0226* (2013.01)

(58) Field of Classification Search
CPC . H05K 5/0017; H05K 5/0226; H04M 1/0216; H04M 1/0268; H04M 1/185;
(Continued)

(56) References Cited

U.S. PATENT DOCUMENTS

| | | | |
|---|---|---|---|
| 6,577,496 | B1 | 6/2003 | Gioscia et al. |
| 6,909,475 | B2 | 6/2005 | Kojima et al. |

(Continued)

FOREIGN PATENT DOCUMENTS

| | | | |
|---|---|---|---|
| CN | 106486018 | A | 3/2017 |
| CN | 107547700 | A | 1/2018 |

(Continued)

OTHER PUBLICATIONS

International Search Report dated Aug. 14, 2020, issued in International Patent Application No. PCT/KR2020/005600.

(Continued)

*Primary Examiner* — Abhishek M Rathod
(74) *Attorney, Agent, or Firm* — Jefferson IP Law, LLP

(57) ABSTRACT

An electronic device is provided. The electronic device includes a hinge housing extending in a direction of a rotational axis, a first housing connected to one side of the hinge housing in a direction perpendicular to the rotational axis to rotate about the rotational axis relative to the hinge housing, a second housing connected to an opposite side of the hinge housing in a direction perpendicular to the rotational axis to rotate about the rotational axis relative to the hinge housing, and a flexible display including a bending area at least partially disposed in the hinge housing and formed to be a flat surface or a curved surface, a first area (Continued)

extending from the bending area in one direction perpendicular to the rotational axis, and a second area extending from the bending area in an opposite direction perpendicular to the rotational axis.

15 Claims, 16 Drawing Sheets

Related U.S. Application Data continuation of application No. 18/178,171, filed on Mar. 3, 2023, now Pat. No. 11,877,406, which is a continuation of application No. 16/861,989, filed on Apr. 29, 2020, now Pat. No. 11,602,058.

(51) Int. Cl.
*H04M 1/18* (2006.01)
*H05K 5/00* (2025.01)

(58) Field of Classification Search
CPC ... H04M 1/0214; H04M 1/026; G06F 1/1626; G06F 1/1637; G06F 1/1641; G06F 1/1647; G06F 1/165; G06F 1/1656; G06F 1/1652; G06F 1/1681; G06F 1/1686; G06F 2203/04102; G09F 9/301
See application file for complete search history.

(56) References Cited

U.S. PATENT DOCUMENTS 7,645,022 B2 1/2010 Silverbrook et al.
8,118,395 B2 2/2012 Silverbrook et al.
8,937,804 B2 1/2015 Tanaka
9,075,567 B2 7/2015 Mathew et al.
9,535,452 B2 1/2017 Ahn
9,690,407 B2 * 6/2017 Chien .................. H04B 1/3888
9,715,257 B2 7/2017 Manullang et al.
9,786,207 B2 10/2017 Kim et al.
9,791,892 B2 10/2017 Park et al.
9,818,974 B2 11/2017 Kwon et al.
9,874,904 B2 1/2018 Xu
10,032,391 B2 7/2018 Kim et al.
10,104,790 B2 10/2018 Lee et al.
10,306,783 B2 5/2019 Seo et al.
10,306,788 B2 5/2019 Bi et al.
10,403,177 B2 9/2019 Lim
10,412,846 B1 9/2019 Phan Thanh et al.
10,466,747 B2 11/2019 Yun et al.
10,509,439 B2 12/2019 Choi et al.
11,112,631 B2 9/2021 Oh
2007/0229727 A1 10/2007 Yamazaki
2010/0061040 A1 3/2010 Dabov et al.
2010/0110139 A1 5/2010 Silverbrook et al.
2011/0063783 A1 3/2011 Shim et al.
2011/0103041 A1 5/2011 Mathew et al.
2012/0281383 A1 11/2012 Hwang et al.
2013/0188301 A1 7/2013 Tanaka
2014/0313746 A1 10/2014 Song et al.
2015/0245513 A1 8/2015 Moon
2015/0301565 A1 10/2015 Manullang et al.
2015/0366089 A1 12/2015 Park et al.
2016/0044801 A1 2/2016 Lee et al.
2016/0062391 A1 3/2016 Choi et al.
2016/0066412 A1 3/2016 Choi et al.
2016/0066440 A1 3/2016 Choi et al.
2016/0070306 A1 3/2016 Shin et al.
2016/0187935 A1 6/2016 Tazbaz et al.
2016/0295709 A1 10/2016 Ahn
2017/0061836 A1 3/2017 Kim et al.
2017/0179423 A1 6/2017 Kwon et al.
2017/0365197 A1 12/2017 Kim et al.
2017/0374749 A1 12/2017 Lee et al.
2018/0032108 A1 2/2018 Park et al.
2018/0110139 A1 4/2018 Seo et al.
2018/0295735 A1 10/2018 Ahn
2018/0317333 A1 11/2018 Bi
2018/0343332 A1 11/2018 Kim et al.
2019/0012028 A1 1/2019 Park
2019/0033920 A1 1/2019 Yun et al.
2019/0079561 A1 3/2019 Park et al.
2019/0094906 A1 3/2019 Choi et al.
2020/0192435 A1 6/2020 Park

FOREIGN PATENT DOCUMENTS

CN 108831311 A 11/2018
CN 208737802 U 4/2019
JP 2011-112891 A 6/2011
KR 10-2013-0085218 A 7/2013
KR 10-2016-0024151 A 3/2016
KR 10-2016-0027878 A 3/2016
KR 10-2016-0118407 A 10/2016
KR 10-2017-0071986 A 6/2017
KR 10-2018-0001818 A 1/2018
KR 10-2018-0040968 A 4/2018

OTHER PUBLICATIONS

Extended European Search Report dated Oct. 6, 2020, issued in European Patent Application No. 20172601.5-1216.
European Search Report dated Jul. 18, 2023, issued in European Application No. 23168617.1.
Korean Notice of Allowance dated Feb. 22, 2024, issued in Korean Application No. 10-2023-0063150.
Korean Office Action dated Apr. 2, 2024, issued in Korean Application No. 10-2019-0052458.
European Search Report dated May 17, 2024, issued in European Application No. 24154939.3.
Korean Notice of Allowance dated Jul. 30, 2024, issued in Korean Application No. 10-2024-0069386.
Chinese Office Action dated Nov. 11, 2024, issued in Chinese Application No. 202010369914.0.
Korean Office Action dated Dec. 4, 2024, issued in Korean Application No. 10-2019-0052458.
U.S. Notice of Allowance dated Dec. 13, 2024, issued in U.S. Appl. No. 18/541,998.
Chinese Notice of Allowance dated Jun. 18, 2025, issued in Chinese Application No. 202010369914.0.
Indian Office Action dated May 6, 2026, issued in Indian Application No. 202318028186.

* cited by examiner

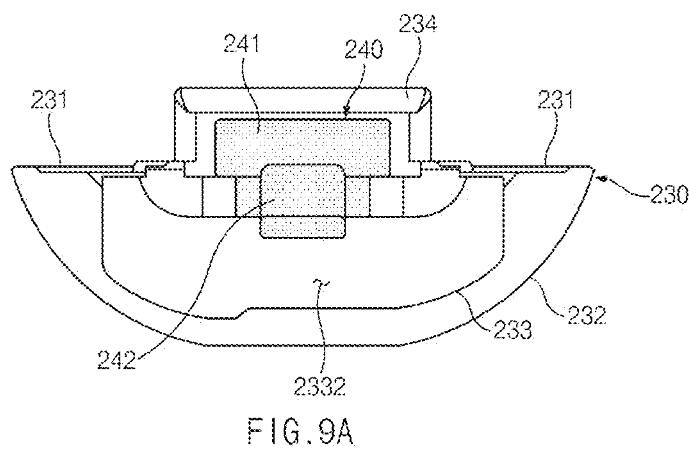
FIG.9A
250
251
252
254
255
F
234
253
231
231
241
230
242
2332
240
233
232
①
②
FIG.9B
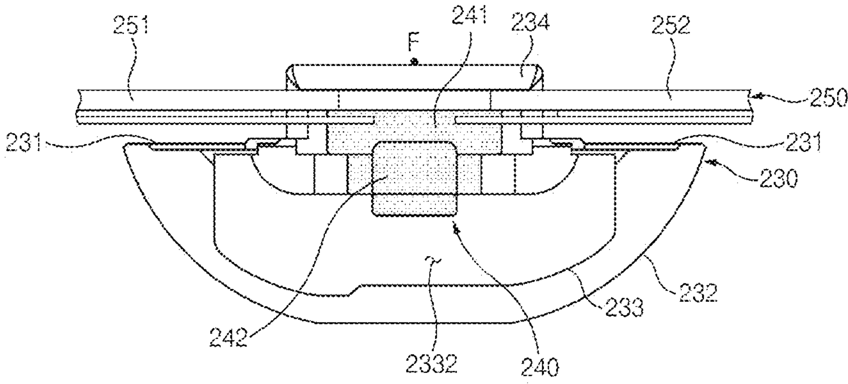
FIG.9C

ELECTRONIC DEVICE INCLUDING DISPLAY AND A CUSHION MEMBER

CROSS-REFERENCE TO RELATED APPLICATION(S)

This application is a continuation application of prior application Ser. No. 18/541,998, filed on Dec. 15, 2023, which is a continuation application of prior application Ser. No. 18/178,171, filed on Mar. 3, 2023, which has issued as U.S. Pat. No. 11,877,406 on Jan. 16, 2024, which is a continuation application of prior application Ser. No. 16/861,989, filed on Apr. 29, 2020, which has issued as U.S. Pat. No. 11,602,058 on Mar. 7, 2023 and is based on and claims priority under 35 U.S.C. § 119 (a) of a Korean patent application number 10-2019-0052458, filed on May 3, 2019, in the Korean Intellectual Property Office, the disclosure of which is incorporated by reference herein in its entirety.

BACKGROUND

1. Field

The disclosure relates to an electronic device including a display.

2. Description of Related Art

A foldable electronic device may include a flexible display including a bending area, a portion of which is able to be deformed into a curved surface or a flat surface. The foldable electronic device may include a flat state for providing a large screen to a user and a folded state for providing mobility to the user.

The flexible display may include a plurality of layers. In the folded state, shear stress depending on a difference in radius of curvature between the layers may be formed in the bending area of the flexible display. As a result, the bending area may be vulnerable to external shock, compared to other areas.

The above information is presented as background information only to assist with an understanding of the disclosure. No determination has been made, and no assertion is made, as to whether any of the above might be applicable as prior art with regard to the disclosure.

SUMMARY

The foldable electronic device may include the flexible display and a housing structure in which the flexible display is mounted. In the case where external shock (e.g., a drop impact) is applied to the foldable electronic device, shear stress may be generated between the housing structure and the flexible display. The shear stress may deteriorate the surface quality of the flexible display. To relieve the shear stress, the flexible display may be attached to the housing structure so as to be movable in a certain range.

In the case where external shock (e.g., a drop impact) is applied to the foldable electronic device, the flexible display coupled to the housing structure so as to be movable may collide with an internal structure of the housing structure. The housing structure formed of a rigid material may damage the flexible display. In particular, the bending area relatively vulnerable to shock may be damaged.

In accordance with an aspect of the disclosure, to address at least the above-mentioned problems and/or disadvantages and to is provided. The above-mentioned problems include at least the advantages described below. Accordingly, an aspect of the disclosure is to provide an electronic device for preventing a flexible display from colliding with a rigid structure in a housing structure and absorbing external shock.

Additional aspects will be set forth in part in the description which follows and, in part, will be apparent from the description, or may be learned by practice of the presented embodiments.

In accordance with an aspect of the disclosure, an electronic device is provided. The electronic device includes a hinge housing extending in a direction of a rotational axis, a first housing connected to one side of the hinge housing in a direction perpendicular to the rotational axis to rotate about the rotational axis relative to the hinge housing, a second housing connected to an opposite side of the hinge housing in a direction perpendicular to the rotational axis to rotate about the rotational axis relative to the hinge housing, and a flexible display including a bending area at least partially disposed in the hinge housing and formed to be a flat surface or a curved surface, a first area extending from the bending area in one direction perpendicular to the rotational axis, and a second area extending from the bending area in an opposite direction perpendicular to the rotational axis. The hinge housing includes protruding portions formed on opposite end portions of the hinge housing in the direction of the rotational axis and adjacent to a periphery of the flexible display and cushioning members disposed between the protruding portions and the periphery of the flexible display and spaced apart from the periphery of the flexible display by a certain gap.

In accordance with another aspect of the disclosure, an electronic device is provided. The electronic device includes a housing structure including a first housing, a second housing, and a hinge housing disposed between the first housing and the second housing, in which the first housing and the second housing are configured to be folded toward each other about a folding axis aligned with the hinge housing, a flexible display including a bending area at least partially disposed in the hinge housing and formed to be a flat surface or a curved surface, a first area that extends from the bending area and that is disposed in the first housing, and a second area that extends from the bending area and that is disposed in the second housing, and a shock-relieving structure that absorbs shock applied to the flexible display. The hinge housing includes a sidewall, at least a portion of which faces a direction of the folding axis. The shock-relieving structure includes a shock-absorbing member formed between the sidewall and a periphery of the flexible display.

In accordance with another aspect of the disclosure, an electronic device is provided. The electronic device includes a flexible display including a first area formed to be a flat surface, a second area formed to be a flat surface, and a bending area formed between the first area and the second area and formed to be a flat surface or a curved surface, a housing structure that surrounds a periphery of the flexible display and that includes a frame structure spaced apart from the periphery by a first gap, and a shock-relieving structure including a shock-absorbing member formed between the frame structure and the periphery of the flexible display and spaced apart from the periphery by a second gap smaller than the first gap.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 9A, 9B, and 9C are views illustrating the hinge housing and the flexible display of the electronic device according to various embodiments of the disclosure;

Throughout the drawings, it should be noted that like reference numerals are used to depict the same or similar elements, features, and structures.

DETAILED DESCRIPTION

The following description with reference to the accompanying drawings provided to assist in a comprehensive understanding of various embodiments of the disclosure as defined by the claims and their equivalents. It includes various specific details to assist in that understanding, but these are to be regarded as merely exemplary. Accordingly, those of ordinary skill in the art will recognize that various changes and modifications, of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used by the inventor to enable a clear and consistent understanding of the disclosure. Accordingly, it should be apparent to those skilled in the art that the following description of various embodiments of the disclosure is provided for illustration purposes only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
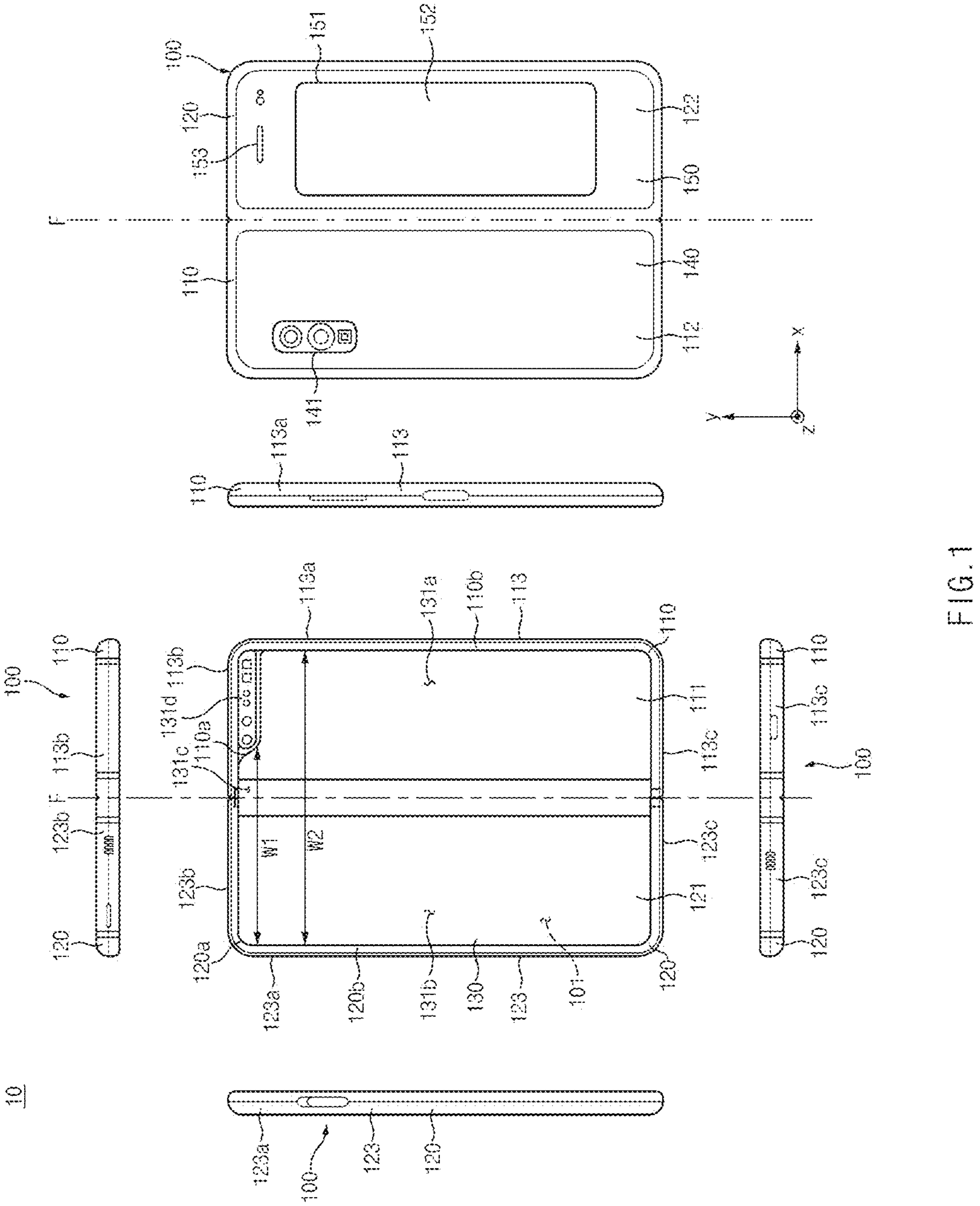
FIG. 1 is a view illustrating a flat state of an electronic device according to an embodiment of the disclosure.

FIG. 1 is a view illustrating a flat state of an electronic device according to an embodiment of the disclosure.

Figure 2:
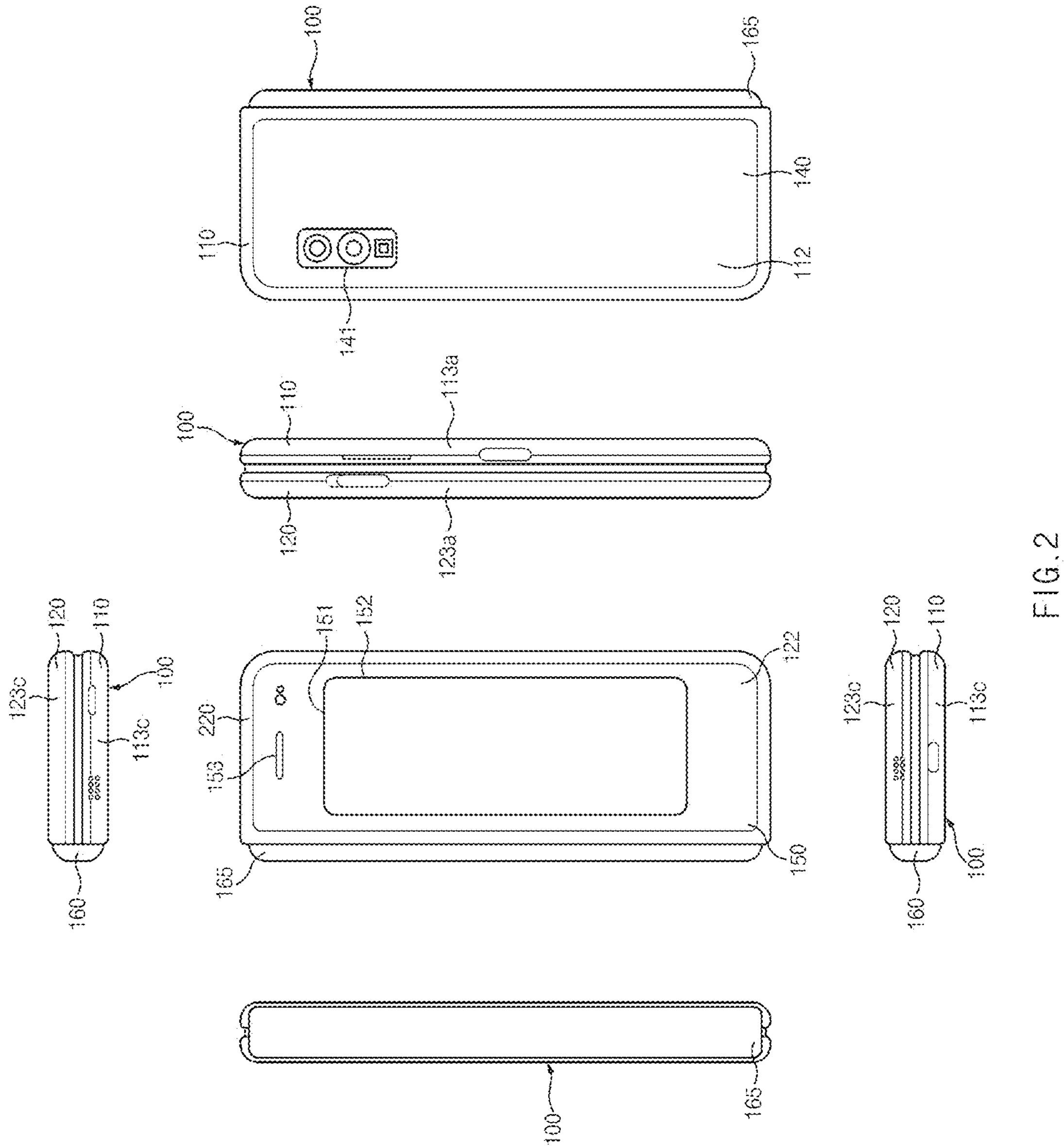
FIG. 2 is a view illustrating a folded state of the electronic device of FIG. 1 according to an embodiment of the disclosure.

FIG. 2 is a view illustrating a folded state of the electronic device of FIG. 1 according to an embodiment of the disclosure.

Referring to FIG. 1, the electronic device 100 may include a pair of housing structures 110 and 120 (e.g., foldable housing structures) that are coupled to pivot around a hinge structure (e.g., a hinge structure 164 of FIG. 3) so as to be folded relative to each other, a hinge cover (e.g., a hinge cover 165 of FIG. 5) that covers foldable portions of the pair of housing structures 110 and 120, and a display 130 (e.g., a flexible display or a foldable display) that is disposed in a space formed by the pair of housing structures 110 and 120. In this disclosure, a surface on which the display 130 is disposed may be defined as a front surface of the electronic device 100, and an opposite surface to the front surface may be defined as a rear surface of the electronic device 100. Furthermore, surfaces surrounding a space between the front surface and the rear surface may be defined as side surfaces of the electronic device 100.

The pair of housing structures 110 and 120 may include the first housing structure 110 including a sensor area 131*d*, the second housing structure 120, a first back cover 140, and a second back cover 150. The pair of housing structures 110 and 120 of the electronic device 100 are not limited to the form and coupling illustrated in FIGS. 1 and 2 and may be implemented by a combination and/or coupling of other shapes or parts. For example, the first housing structure 110 and the first back cover 140 may be integrated with each other, and the second housing structure 120 and the second back cover 150 may be integrated with each other.

The first housing structure 110 and the second housing structure 120 may be disposed on opposite sides of a folding axis (an axis F) and may have shapes that are entirely symmetric to each other with respect to the folding axis (the axis F). The angle or distance that the first housing structure 110 and the second housing structure 120 form may vary depending on whether the electronic device 100 is in a flat state or a closing state, a folded state, or an intermediate state. Unlike the second housing structure 120, the first housing structure 110 may additionally include the sensor area 131*d* in which various sensors are disposed, but may have a mutually symmetrical shape in the other area. The sensor area 131*d* may be additionally disposed in, or replaced with, at least a partial area of the second housing structure 120.

The first housing structure 110 may be connected to the hinge structure (e.g., the hinge structure 164 of FIG. 3) in a flat state of the electronic device 100 and may include a first surface 111 disposed to face toward the front surface of the electronic device 100, a second surface 112 facing away from the first surface 111, and a first side member 113 surrounding at least a portion of a space between the first surface 111 and the second surface 112. The first side member 113 may include a first side surface 113*a* disposed parallel with the folding axis (the axis F), a second side surface 113*b* extending from one end of the first side surface 113*a* in a direction perpendicular to the folding axis, and a third side surface 113*c* extending from an opposite end of the first side surface 113*a* in the direction perpendicular to the folding axis (the axis F).

The second housing structure 120 may be connected to the hinge structure (e.g., the hinge structure 164 of FIG. 3) in the flat state of the electronic device 100 and may include a third surface 121 disposed to face toward the front surface of the electronic device 100, a fourth surface 122 facing away from the third surface 121, and a second side member 123 surrounding at least a portion of a space between the third surface 121 and the fourth surface 122. The second side member 123 may include a fourth side surface 123*a* disposed parallel with the folding axis (the axis F), a fifth side surface 123*b* extending from one end of the fourth side surface 123*a* in a direction perpendicular to the folding axis (the axis F), and a sixth side surface 123*c* extending from an opposite end of the fourth side surface 123*a* in the direction perpendicular to the folding axis (the axis F). In an embodiment, the third surface 121 may face the first surface 111 in a folded state.

The electronic device 100 may include a recess 101 formed to receive the display 130 through a structural shape coupling of the first housing structure 110 and the second housing structure 120. The recess 101 may have substantially the same size as the display 130. Due to the sensor area 131*d*, the recess 101 may have two or more different widths in the direction perpendicular to the folding axis (the axis F). For example, the recess 101 may have a first width w1 between a first portion 120*a* of the second housing structure 120 that is parallel to the folding axis (the axis F) and a first portion 110*a* of the first housing structure 110 that is formed on the periphery of the sensor area 131*d* and a second width w2 formed by a second portion 120*b* of the second housing structure 120 and a second portion 110*b* of the first housing structure 110 that does not correspond to the sensor area 131*d* and that is parallel to the folding axis (the axis F). In this case, the second width w2 may be formed to be greater than the first width w1. For example, the recess 101 may be formed to have the first width W1 between the first portion 110*a* of the first housing structure 110 and the first portion 120*a* of the second housing structure 120 that have mutually asymmetric shapes and the second width W2 between the second portion 110*b* of the first housing structure 110 and the second portion 120*b* of the second housing structure 120 that have mutually symmetric shapes.

The first portion 110*a* and the second portion 110*b* of the first housing structure 110 may be formed to have different distances from the folding axis (the axis F). The width of the recess 101 is not limited to the illustrated example. The recess 101 may have two or more different widths due to the form of the sensor area 131*d* or the asymmetrically-shaped portions of the first housing structure 110 and the second housing structure 120.

At least a portion of the first housing structure 110 and at least a portion of the second housing structure 120 may be formed of a metallic material or a non-metallic material that has a stiffness selected to support the display 130.

The sensor area 131*d* may be formed to have a certain area adjacent to one corner of the first housing structure 110. However, the arrangement, shape, or size of the sensor area 131*d* is not limited to the illustrated example. For example, the sensor area 131*d* may be provided in another corner of the first housing structure 110 or in any area between an upper corner and a lower corner of the first housing structure 110. In another embodiment, the sensor area 131*d* may be disposed in at least a partial area of the second housing structure 120. The sensor area 131*d* may be disposed to extend to the first housing structure 110 and the second housing structure 120. The electronic device 100 may include parts that perform various functions and that are disposed to be exposed on the front surface of the electronic device 100 though the sensor area 131*d* or through one or more openings formed in the sensor area 131*d*. In various embodiments, the parts may include, for example, at least one of a front camera device, a receiver, a proximity sensor, an illuminance sensor, an iris recognition sensor, an ultrasonic sensor, or an indicator.

The first back cover 140 may be disposed on the second surface 112 of the first housing structure 110 and may have a substantially rectangular periphery. At least a portion of the periphery may be surrounded by the first housing structure 110. Similarly, the second back cover 150 may be disposed on the fourth surface 122 of the second housing structure 120, and at least a portion of the periphery of the second back cover 150 may be surrounded by the second housing structure 120.

In the illustrated embodiment, the first back cover 140 and the second back cover 150 may have substantially symmetrical shapes with respect to the folding axis (the axis F). In other embodiments, the first back cover 140 and the second back cover 150 may include various different shapes. The first back cover 140 may be integrated with the first housing structure 110, and the second back cover 150 may be integrated with the second housing structure 120.

The first back cover 140, the second back cover 150, the first housing structure 110, and the second housing structure 120 may provide, through a mutually coupled structure, a space in which various parts (e.g., a printed circuit board, an antenna module, a sensor module, or a battery) of the electronic device 100 are disposed. One or more parts may be disposed, or visually exposed, on the rear surface of the electronic device 100. For example, one or more parts or sensors may be visually exposed through a first rear area 141 of the first back cover 140. The sensors may include a proximity sensor, a rear camera device, and/or a flash. At least a portion of a sub-display 152 may be visually exposed through a second rear area 151 of the second back cover 150. The electronic device 100 may include a speaker module 153 disposed through at least a partial area of the second back cover 150.

The display 130 may be disposed on the space formed by the pair of housing structures 110 and 120. For example, the display 130 may be mounted in the recess 101 formed by the pair of housing structures 110 and 120 and may be disposed to occupy substantially the entire front surface of the electronic device 100. Accordingly, the front surface of the electronic device 100 may include the display 130, a partial area (e.g., a peripheral area) of the first housing structure 110 that is adjacent to the display 130, and a partial area (e.g., a peripheral area) of the second housing structure 120 that is adjacent to the display 130. The rear surface of the electronic device 100 may include the first back cover 140, a partial area (e.g., a peripheral area) of the first housing structure 110 that is adjacent to the first back cover 140, the second back cover 150, and a partial area (e.g., a peripheral area) of the second housing structure 120 that is adjacent to the second back cover 150.

The display 130 may refer to a display, at least a partial area of which is able to be deformed into a flat surface or a curved surface. In an embodiment, the display 130 may include a folding area 131*c*, a first area 131*a* disposed on one side of the folding area 131*c* (e.g., the right side of the folding area 131*c*), and a second area 131*b* disposed on an opposite side of the folding area 131*c* (e.g., the left side of the folding area 131*c*). For example, the first area 131*a* may be disposed on the first surface 111 of the first housing structure 110, and the second area 131*b* may be disposed on the third surface 121 of the second housing structure 120. In an embodiment, the division of the display 130 into the areas is illustrative, and the display 130 may be divided into a plurality of areas (e.g., four or more areas, or two areas) depending on the structure or function of the display 130. For example, in the embodiment illustrated in FIG. 1, the areas of the display 130 may be divided from each other by the folding area 131*c* or the folding axis (the axis F) that extends parallel to the y axis. However, in another embodiment, the display 130 may be divided into areas with respect to a different folding area (e.g., a folding area parallel to the x axis) or a different folding axis (e.g., a folding axis parallel to the x axis). The above-described division of the display 130 into the areas may be merely a physical division by the pair of housing structures 110 and 120 and the hinge structure (e.g., the hinge structure 164 of FIG. 3), and one full screen may be displayed on the display 130 substantially through the pair of housing structures 110 and 120 and the hinge structure (e.g., the hinge structure 164 of FIG. 3).

The first area 131*a* and the second area 131*b* may have shapes that are entirely symmetric to each other with respect to the folding area 131*c*. However, unlike the second area 131*b*, the first area 131*a* may include a notch area (e.g., a notch area 133 of FIG. 3) that is cut depending on the presence of the sensor area 131*d*, but in the other area, the first area 131*a* may have a shape that is symmetric to the second area 131*b*. For example, the first area 131*a* and the second area 131*b* may include a portion having a symmetrical shape and a portion having an asymmetrical shape.

Figure 3:
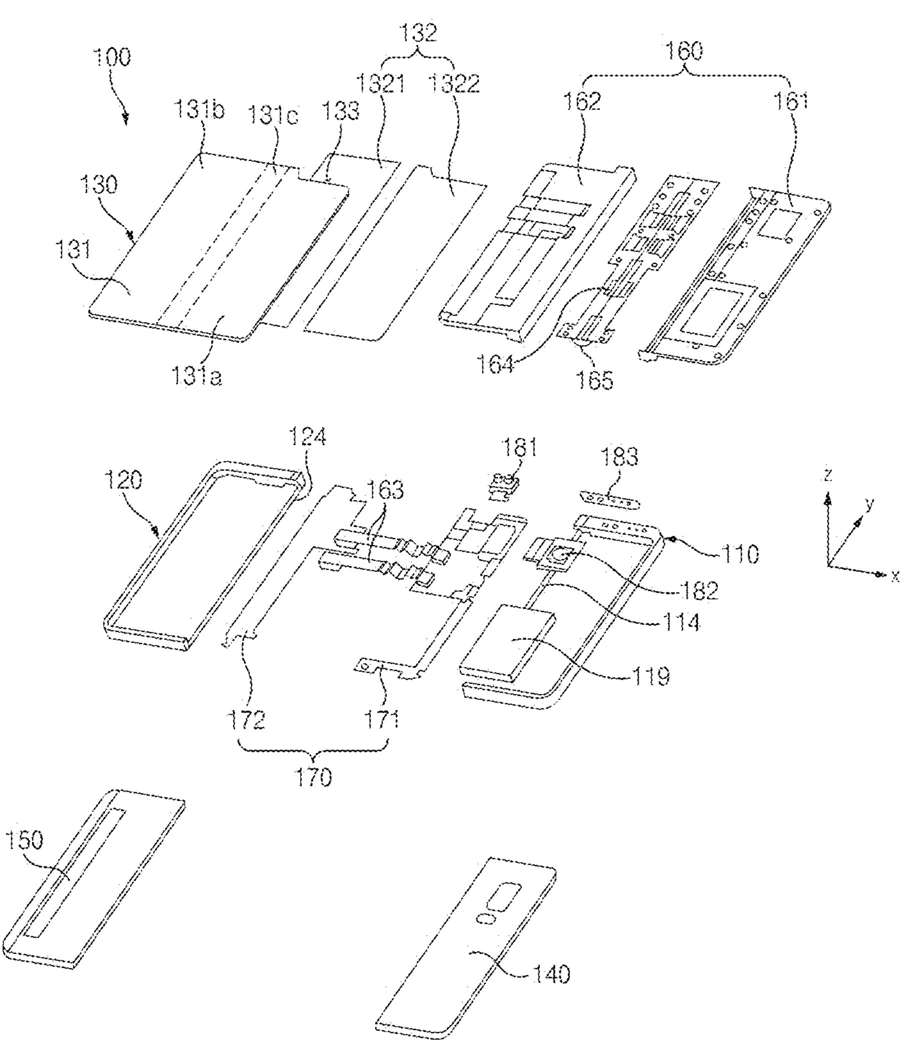
FIG. 3 is an exploded perspective view of the electronic device according to an embodiment of the disclosure.

Referring to FIG. 2, the hinge cover 165 may be disposed between the first housing structure 110 and the second housing structure 120 and may be configured to hide an internal part (e.g., the hinge structure 164 of FIG. 3). In an embodiment, the hinge cover 165 may be hidden by a portion of the first housing structure 110 and a portion of the second housing structure 120, or may be exposed to the outside, depending on an operational state (a flat state or a folded state) of the electronic device 100.

For example, in the case where the electronic device 100 is in a flat state as illustrated in FIG. 1, the hinge cover 165 may not be exposed by being hidden by the first housing structure 110 and the second housing structure 120. In another example, in the case where the electronic device 100 is in a folded state (e.g., a fully folded state) as illustrated in FIG. 2, the hinge cover 165 may be exposed to the outside from between the first housing structure 110 and the second housing structure 120. In another example, in the case where the electronic device 100 is in an intermediate state in which the first housing structure 110 and the second housing structure 120 are folded with a certain angle, the hinge cover 165 may be at least partially exposed to the outside of the electronic device 100 from between the first housing structure 110 and the second housing structure 120. In this case, the exposed area may be smaller than that in the fully folded state. In an embodiment, the hinge cover 165 may include a curved surface.

Hereinafter, operations of the first housing structure 110 and the second housing structure 120 and the areas of the display 130 depending on an operational state (e.g., a flat state or a folded state) of the electronic device 100 will be described.

In the case where the electronic device 100 is in a flat state (e.g., the state of FIG. 1), the first housing structure 110 and the second housing structure 120 may form an angle of 180 degrees, and the first area 131*a* and the second area 131*b* of the display 130 may be disposed to face the same direction. Furthermore, the folding area 131*c*, together with the first area 131*a* and the second area 131*b*, may form the same plane. In another embodiment of the disclosure, in the case where the electronic device 100 is in the flat state, the first housing structure 110 and the second housing structure 120 may rotate relative to each other through an angle of 360 degrees and may be oppositely folded such that the second surface 112 and the fourth surface 122 face each other.

In the case where the electronic device 100 is in a folded state (e.g., the state of FIG. 2), the first housing structure 110 and the second housing structure 120 may be disposed to face each other. The first area 131*a* and the second area 131*b* of the display 130 may face each other while forming a narrow angle (e.g., between 0 degrees and 10 degrees). At least a portion of the folding area 131*c* may be formed to be a curved surface having a certain curvature.

In the case where the electronic device 100 is in an intermediate state, the first housing structure 110 and the second housing structure 120 may be disposed at a certain angle. The first area 131*a* and the second area 131*b* of the display 130 may form an angle that is larger than that in the folded state and is smaller than that in the flat state. At least a portion of the folding area 131*c* may be formed to be a curved surface having a certain curvature, and in this case, the curvature may be smaller than that in the folded state.

FIG. 3 is an exploded perspective view of the electronic device 100 according to an embodiment of the disclosure.

Referring to FIG. 3, in an embodiment, the electronic device 100 may include the display 130, a support member assembly 160, at least one printed circuit board 170, the first housing structure 110, the second housing structure 120, the first back cover 140, and the second back cover 150. In this disclosure, the display 130 may be referred to as the display module or the display assembly.

The display 130 may include a display panel 131 (e.g., a flexible display panel) and one or more plates 132 or layers on which the display panel 131 is mounted. In an embodiment, the plates 132 may be disposed between the display panel 131 and the support member assembly 160. The display panel 131 may be disposed on at least a portion of one surface of the plates 132. The plates 132 may include a first plate 1321 and a second plate 1322 divided from each other with respect to the hinge structure 164. The plates 132 may include at least one member that is unable to be folded together when the first housing structure 110 and the second housing structure 120 are rotated into a folded and/or flat state with respect to the hinge structure 164. The plates 132 may include at least one subsidiary material layer (e.g., graphite member) and/or conductive plate (e.g., Cu sheet) disposed on a rear surface of the display panel 131. The plates 132 may be formed in a shape corresponding to the display panel 131. For example, a partial area of the first plate 1321 may be formed in a shape corresponding to the notch area 133 of the display panel 131.

The support member assembly 160 may include a first support member 161, a second support member 162, the hinge structure 164 disposed between the first support member 161 and the second support member 162, the hinge cover 165 covering the hinge structure 164 when the hinge structure 164 is viewed from the outside, and at least one wiring member 163 (e.g., a flexible printed circuit board (FPCB)) across the first support member 161 and the second support member 162.

The support member assembly 160 may be disposed between the plates 132 and the at least one printed circuit board 170. For example, the first support member 161 may be disposed between the first area 131*a* of the display 130 and a first printed circuit board 171. The second support member 162 may be disposed between the second area 131*b* of the display 130 and a second printed circuit board 172.

The wiring members 163 and at least a portion of the hinge structure 164 may be disposed inside the support member assembly 160. The wiring member 163 may be disposed in a direction (e.g., the x-axis direction) across the first support member 161 and the second support member 162. The wiring members 163 may be disposed in a direction (e.g., the x-axis direction) perpendicular to the folding axis of the folding area 131*c* (e.g., the y-axis or the folding axis F of FIG. 1).

The at least one printed circuit board 170, as mentioned above, may include the first printed circuit board 171 disposed on one side of the first support member 161 and the second printed circuit board 172 disposed on one side of the second support member 162. The first printed circuit board 171 and the second printed circuit board 172 may be disposed in a space that is formed by the support member assembly 160, the first housing structure 110, the second housing structure 120, the first back cover 140, and the second back cover 150. Parts for implementing various functions of the electronic device 100 may be mounted on the first printed circuit board 171 and the second printed circuit board 172.

The first housing structure 110 may contain the first printed circuit board 171, a battery 119, at least one sensor module 181, or at least one camera module 182 that is disposed in a space formed through the first support member 161. The first housing structure 110 may include a window glass 183 disposed to protect the at least one sensor module 181 and the at least one camera module 182 in a position corresponding to the notch area 133 of the display 130. The second housing structure 120 may contain the second printed circuit board 172 disposed in a space formed through the second support member 162. The first housing structure 110 and the first support member 161 may be integrated with each other. The second housing structure 120 and the second support member 162 may also be integrated with each other.

The first housing structure 110 may include a first rotation support surface 114, and the second housing structure 120 may include a second rotation support surface 124 corresponding to the first rotation support surface 114. The first rotation support surface 114 and the second rotation support surface 124 may include a curved surface corresponding to a curved surface included in the hinge cover 165.

In the case where the electronic device 100 is in a flat state (e.g., the state of FIG. 1), the first rotation support surface 114 and the second rotation support surface 124 may cover the hinge cover 165 so as not to expose the hinge cover 165 through the rear surface of the electronic device 100 or so as to minimally expose the hinge cover 165. In another embodiment of the disclosure, in the case where the electronic device 100 is in a folded state (e.g., the state of FIG. 2), the first rotation support surface 114 and the second rotation support surface 124 may rotate along the curved surfaces included in the hinge cover 165 to maximally expose the hinge cover 165 through the rear surface of the electronic device 100.

Figures 4A, 4B:
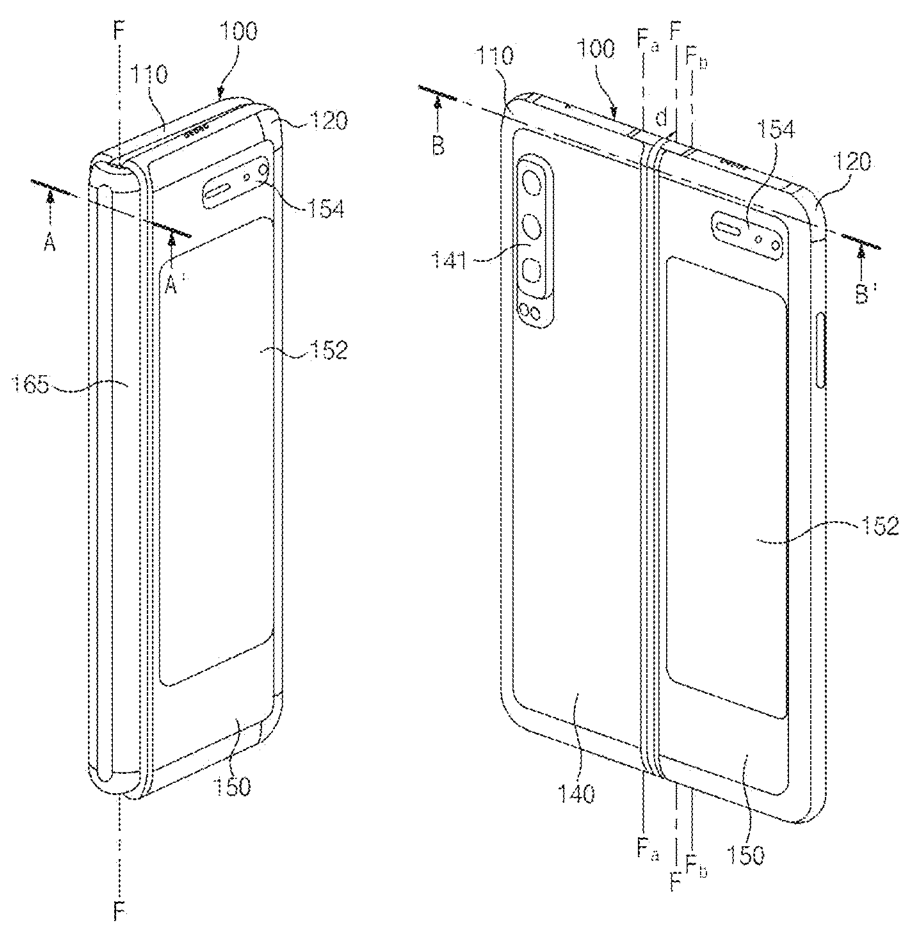
FIGS. 4A and 4B are views illustrating a folded state and a flat state of the electronic device according to various embodiments of the disclosure.

FIGS. 4A and 4B are views illustrating a folded state and a flat state of the electronic device according to various embodiments of the disclosure.

Referring to FIGS. 4A and 4B, the electronic device 100 disclosed herein may include a folded state (FIG. 4A) and a flat state (FIG. 4B). The folded state (FIG. 4A) and the flat state (FIG. 4B) may be defined depending on whether the hinge cover 165 forms the exterior of the electronic device 100, whether a folding area (e.g., the folding area 131*c* of FIG. 3) of a flexible display (e.g., the flexible display 130 of FIG. 3) is bent, or the positional relationship between the first housing structure 110 and the second housing structure 120.

In the illustrated embodiment, the folded state (e.g., FIG. 4A) may include a state in which the hinge cover 165 of the electronic device 100 is exposed from between the first housing structure 110 and the second housing structure 120. In this case, the hinge cover 165 may form a portion of the exterior (e.g., the rear surface) of the electronic device 100.

In the illustrated embodiment, the flat state (FIG. 4B) may include a state in which the hinge cover 165 of the electronic device 100 is completely hidden by the first housing structure 110 and the second housing structure 120. In this case, the hinge cover 165 may be received in the first housing structure 110 and the second housing structure 120 and may not form the exterior of the electronic device 100.

In the illustrated embodiment, each of the first housing structure 110 and the second housing structure 120 may be rotated about the hinge cover 165 through a certain angle. The folding axis (the axis F) of the first housing structure 110 and the second housing structure 120 may extend parallel to the direction in which the hinge cover 165 extends. The folding axis (the axis F) may be formed by the above-described hinge structure (e.g., the hinge structure 164 of FIG. 3). The folding axis (the axis F) may refer to a virtual axis about which the first housing structure 110 and the second housing structure 120 rotate. In the folded state, the folding axis (the axis F) may be formed between the first housing structure 110 and the second housing structure 120. The folding axis (the axis F) may be formed in a position spaced apart from the hinge cover 165 at a certain interval d in the direction toward the front surface of the electronic device 100.

The electronic device 100 disclosed herein may include one or more folding axes (the axis F). For example, the folding axes (the axis F) may include a first folding axis (an axis Fa) about which the first housing structure 110 rotates and a second folding axis (an axis Fb) about which the second housing structure 120 rotates. In this case, the first folding axis (the axis Fa) and the second folding axis (the axis Fb) may extend parallel to each other.

The first housing structure 110 may rotate about the first folding axis Fa along an arc-shaped path. The second housing structure 120 may rotate about the second folding axis Fb along an arc-shaped path. The first housing structure 110 and the second housing structure 120 may rotate in opposite directions.

The folding axis F disclosed herein may refer to a central axis about which the first housing structure 110 and the second housing structure 120 are folded or unfolded (a folded state or a flat state), and may not refer to a shaft (e.g., a pivot shaft) that enables physical driving. For example, the first housing structure 110 and the second housing structure 120 may be rotated about the first folding axis Fa and the second folding axis Fb along the arc-shaped paths in the opposite directions, respectively. Accordingly, the first housing structure 110 and the second housing structure 120 may be folded about the folding axis F.

In the illustrated embodiment, the first housing structure 110 may include the first back cover 140 that forms the rear surface of the electronic device 100 and the rear area 141 formed on the first back cover 140. The first housing structure 110 may be connected to one side of the hinge cover 165 in a direction perpendicular to the folding axis (the axis F). The first housing structure 110 may rotate about the illustrated folding axis (the axis F) relative to the hinge cover 165.

In the illustrated embodiment, the second housing structure 120 may include the second back cover 150 that forms the rear surface of the electronic device 100 and the rear display area 152 and/or a rear sensor area 154 that is formed on the second back cover 150. The second housing structure 120 may be connected to an opposite side of the hinge cover 165 in a direction perpendicular to the folding axis (the axis F). The second housing structure 120 may rotate about the illustrated folding axis (the axis F) relative to the hinge cover 165.

In the illustrated embodiment, the hinge cover 165 may extend in the direction of the folding axis (the axis F). The hinge cover 165 may include a curved surface having a curvature corresponding to the curvature of rotation of the first housing structure 110 or the second housing structure 120.

Figure 5A:
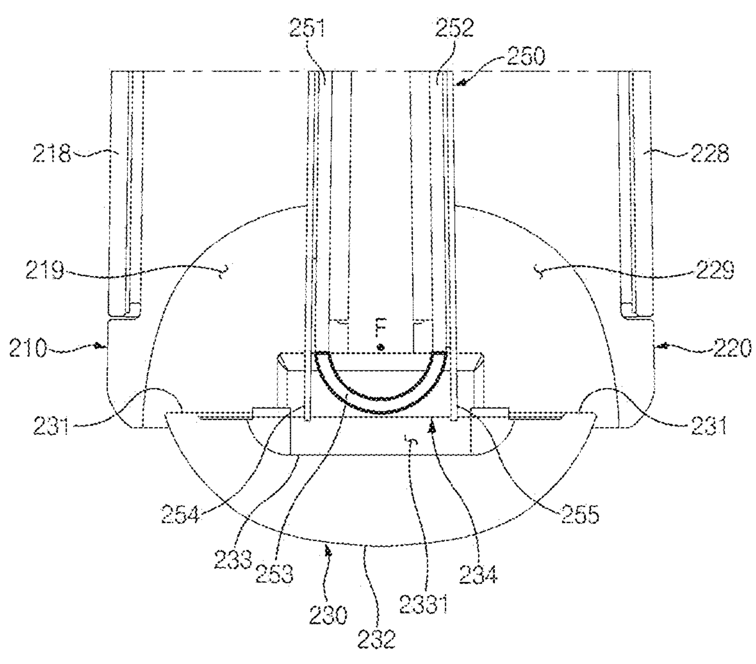
FIGS. 5A and 5B are sectional views illustrating a folded state and a flat state of an electronic device according to various embodiments of the disclosure.
Figure 5B:
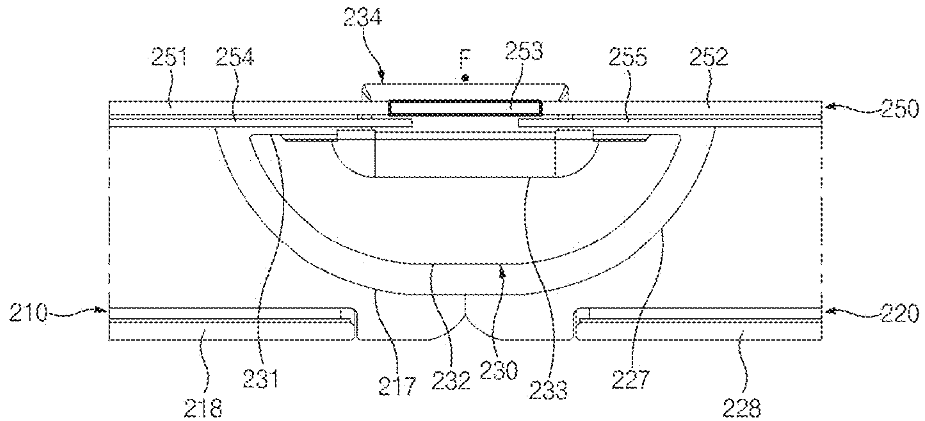

FIGS. 5A and 5B are sectional views illustrating a folded state and a flat state of an electronic device according to various embodiments of the disclosure. FIG. 5A is a sectional view taken along line A-A' of FIG. 4A. FIG. 5B is a sectional view taken along line B-B' of FIG. 4B.

Referring to FIGS. 5A and 5B, the electronic device 200 may include a folded state (FIG. 5A) and a flat state (FIG. 5B). The folded state (FIG. 5A) may include a state in which a folding area 253 of a flexible display 250 is formed to be a curved surface. The flat state (FIG. 5B) may include a state in which the folding area 253 of the flexible display 250 is formed to be a flat surface.

In the illustrated embodiment, the flexible display 250 may include a first area 251 formed to be a flat surface, a second area 252 formed to be a flat surface, and the folding area 253 that is able to be deformed into a flat surface or a curved surface.

The folded state of the electronic device 200 may include a state in which the folding area 253 forms a curved surface having a certain curvature. In this case, the first area 251 and the second area 252 may be disposed such that the normal vectors thereof form a certain angle rather than 0 degrees.

The flat state of the electronic device 200 may include a state in which the folding area 253 forms substantially the same plane as the first area 251 and the second area 252. For example, in the flat state, the first area 251 and the second area 252 may face the same direction (e.g., the direction toward the front surface of the electronic device). In the flat state, the first area 251 and the second area 252 may be disposed such that the normal vectors thereof form 0 degrees.

In the illustrated embodiment, the flexible display 250 may further include metal layers 254 and 255. The metal layers 254 and 255 may support the rear surface of the flexible display 250 to allow the flexible display 250 to remain flat in the flat state. The metal layers 254 and 255 may include the first metal layer 254 that is attached to the rear surface of the first area 251 and that has a portion extending to the folding area 253 and the second metal layer 255 that is attached to the rear surface of the second area 252 and that has a portion extending to the folding area 253. The first metal layer 254 and the second metal layer 255 may be detached from the rear surface of the folding area 253. Accordingly, in the folded state, the first metal layer 254 and the second metal layer 255 may be formed to be flat surfaces that extend from the first area 251 and the second area 252 and face each other. The first metal layer 254 and the second metal layer 255 may extend in tangential directions of the folding area 253 in the folded state. At least a portion of the first metal layer 254 and at least a portion of the second metal layer 255 may be received in a third recess 2331 formed on a hinge housing 230.

In the illustrated embodiment, in the folded state, the flexible display 250 may be disposed such that at least a portion of the folding area 253 is received in the hinge housing 230. At least a portion of the folding area 253 may overlap a protruding portion 234 of the hinge housing 230 when viewed in the direction of the folding axis F.

In the illustrated embodiment, a first housing 210 may include a first back cover 218 that forms the rear surface of the electronic device 200 in the flat state (FIG. 5B). The first back cover 218 may be opposite to the first area 251 of the flexible display 250 in the flat state. A first recess 219 may be formed between the first back cover 218 and the first area 251.

In the illustrated embodiment, the first housing 210 may include the first recess 219 in which at least a portion of the hinge housing 230 is received. The first recess 219 may be formed in a shape that is open toward the hinge housing 230. In this case, the first recess 219 may include a first rotation support surface 217 including a curved surface having a curvature corresponding to the curvature of rotation of the first housing 210.

In the illustrated embodiment, a second housing 220 may include a second back cover 228 that forms the rear surface of the electronic device 200 in the flat state (FIG. 5B). The second back cover 228 may be opposite to the second area 252 of the flexible display 250 in the flat state. A second recess 229 may be formed between the second back cover 228 and the second area 252.

In the illustrated embodiment, the second housing 220 may include the second recess 229 in which at least a portion of the hinge housing 230 is received. The second recess 229 may be formed in a shape that is open toward the hinge housing 230. In this case, the second recess 229 may include a second rotation support surface 227 including a curved surface having a curvature corresponding to the curvature of rotation of the second housing 220.

In the illustrated embodiment, in the flat state, a portion of the hinge housing 230 may be disposed in the first recess 219, and the remaining portion of the hinge housing 230 may be disposed in the second recess 229. Accordingly, the hinge housing 230 may not be exposed to the outside of the electronic device 200. In the folded state, the hinge housing 230, together with the first housing 210 and the second housing 220, may form a portion of the exterior of the electronic device 200.

In the illustrated embodiment, the hinge housing 230 may include a first surface 231 facing toward the rear surface of the flexible display 250 in the flat state, a second surface 232 that is opposite to the first surface 231 and that has at least a portion formed to be a curved surface, and an inner surface 233 that forms the third recess 2331. The third recess 2331 in which a portion of the first metal layer 254 and a portion of the second metal layer 255 are received in the folded state may be formed on the first surface 231. The protruding portion 234 facing the periphery of the flexible display 250 may be formed on the first surface 231 of the hinge housing 230. With respect to the flat state, the protruding portion 234 may protrude from the first surface 231 of the hinge housing 230 in the direction that the flexible display 250 faces (e.g., the direction toward the front surface). The protruding portion 234 may be formed to overlap at least a portion of the folding area 253 of the flexible display 250 when viewed in the direction of the folding axis F. The protruding portion 234 may be formed to overlap the folding area 253, a portion of the first area 251, and a portion of the second area 252 in the flat state when viewed in the direction of the folding axis F.

Figure 6:
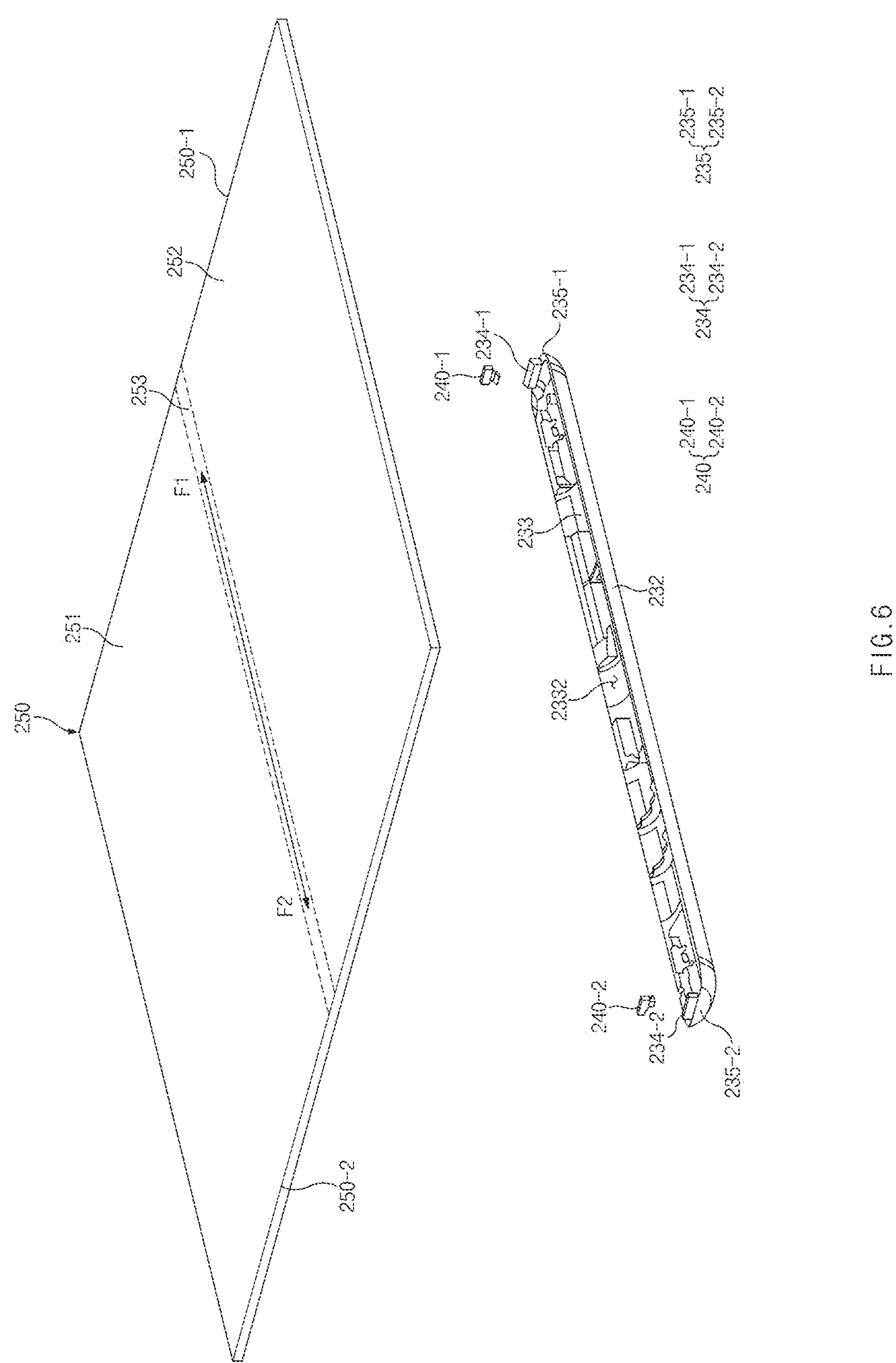
FIG. 6 is a view illustrating a hinge housing of the electronic device according to an embodiment of the disclosure.

FIG. 6 is a view illustrating the hinge housing 230 of the electronic device according to an embodiment of the disclosure.

Referring to FIG. 6, the hinge housing 230 may be formed in a shape extending in a folding axis direction F. The hinge housing 230 may include a sidewall 235 extending from the second surface 232 and including the protruding portion 234. The sidewall 235, together with the inner surface 233, may form an interior space 2332 of the hinge housing 230.

A portion of a hinge structure (e.g., the hinge structure 164 of FIG. 3) and/or a portion of a connecting member (e.g., the connecting member 163 of FIG. 3) may be disposed in the interior space 2332.

In the illustrated embodiment, the sidewall 235 may include a first sidewall 235-1 and a second sidewall 235-2 facing the first sidewall 235-1. A portion of the flexible display 250 may be disposed between the first sidewall 235-1 and the second sidewall 235-2. For example, the folding area 253 may be disposed between the first sidewall 235-1 and the second sidewall 235-2.

The first sidewall 235-1 may include a first protruding portion 234-1 that protrudes toward the front surface of the electronic device 200. The first protruding portion 234-1 may include a surface facing the folding axis direction F. The first protruding portion 234-1 may face a first edge 250-1 of the flexible display 250. The first edge 250-1 may include an edge extending in a direction perpendicular to the folding axis direction F among the edges of the flexible display 250.

The second sidewall 235-2 may include a second protruding portion 234-2 that protrudes toward the front surface of the electronic device 200. The second protruding portion 234-2 may include a surface facing the folding axis direction F. The second protruding portion 234-2 may face a second edge 250-2 of the flexible display 250. The second edge 250-2 may include an edge extending in a direction perpendicular to the folding axis direction F among the edges of the flexible display 250. The second edge 250-2 may be opposite to the first edge 250-1 and may be parallel with the first edge 250-1.

In the illustrated embodiment, the protruding portion 234 may further include a cushioning member 240 formed toward the flexible display 250. The cushioning member 240 may be disposed between the edges 250-1 and 250-2 of the flexible display 250 and the protruding portion 234 to prevent the flexible display 250 from directly colliding with the protruding portion 234.

In the illustrated embodiment, the cushioning member 240 may include a first cushioning member 240-1 disposed between the first edge 250-1 of the flexible display 250 and the first protruding portion 234-1 and a second cushioning member 240-2 disposed between the second edge 250-2 of the flexible display 250 and the second protruding portion 234-2. The first cushioning member 240-1 and the second cushioning member 240-2 may absorb part of shock applied to the flexible display 250.

Figure 7A:
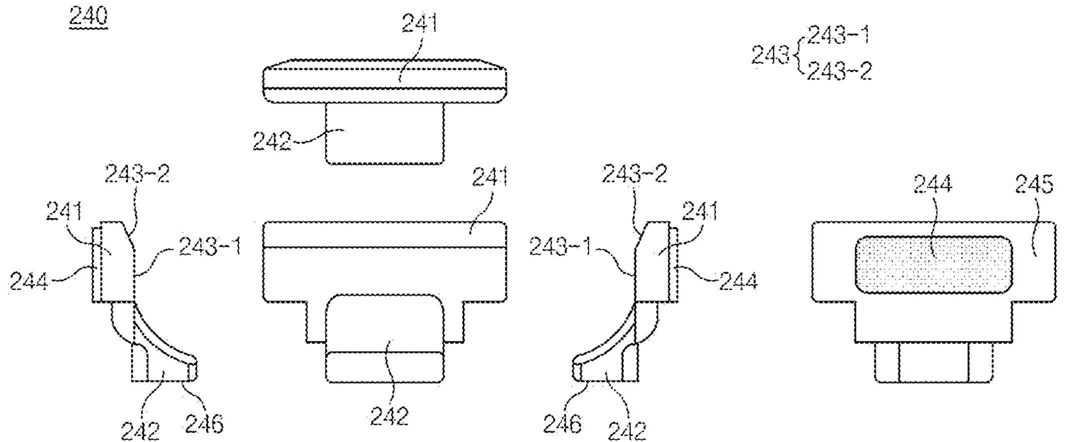
FIGS. 7A and 7B are views illustrating a cushioning member and a protruding portion of the electronic device according to various embodiments of the disclosure.
Figure 7B:
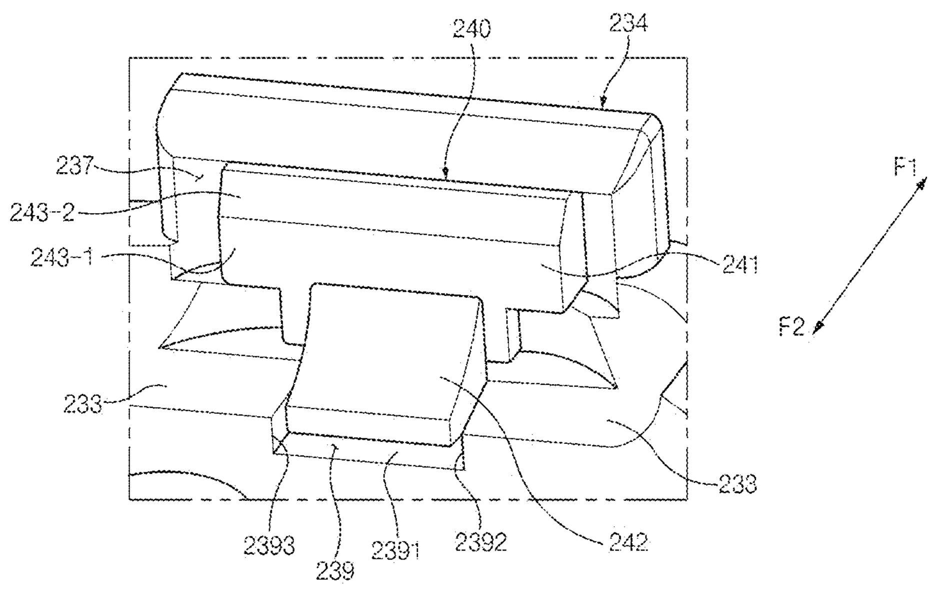

FIGS. 7A and 7B are views illustrating the cushioning member and the protruding portion of the electronic device according to various embodiments of the disclosure.

Referring to FIGS. 7A and 7B, the cushioning member 240 may include a first portion 241 and a second portion 242 extending from the first portion 241. The first portion 241 may include a bonding surface 245 attached to a bottom surface of a first recess 237 of the protruding portion 234 and an opposite surface 243 that is opposite to the bonding surface 245 and that faces toward the interior space 2332 of the hinge housing 230. The bonding surface 245 may include an adhesive member 244 on at least a partial area thereof. The bonding surface 245 may be attached to the bottom surface of the first recess 237 of the protruding portion 234 by the adhesive member 244. The second portion 242 may be received in a second recess 239 formed on the inner surface 233 of the hinge housing 230. The second portion 242 may include a seating surface 246 that is seated on a bottom surface 2391 of the second recess 239.

In the illustrated embodiment, the opposite surface 243 may include a first area 243-1 facing the folding axis direction F and a second area 243-2 that extends from the first area 243-1 and that is inclined with respect to folding axis directions F1 and F2. The first portion 241 may be formed such that the thickness of the portion where the first area 243-1 is formed is greater than the thickness of the portion where the second area 243-2 is formed. That is, the second area 243-2 may obliquely extend from the first area 243-1 to have a decreasing distance to the bonding surface 245.

In the illustrated embodiment, the hinge housing 230 may include the first recess 237 in which the first portion 241 is received and the second recess 239 in which the second portion 242 is received. The bonding surface 245 of the first portion 241 may be attached to the bottom surface of the first recess 237. The second recess 239 may be formed in a shape that is open in the folding axis direction F2. For example, the second recess 239 may be formed in a shape that is open toward the interior space 2332 of the hinge housing 230. This may correspond to the sliding direction and the compression direction of the cushioning member 240 as will be described below with reference to FIGS. 10A to 10C. The seating surface 246 of the second portion 242 may be seated on the bottom surface 2391 of the second recess 239. The bottom surface 2391 of the second recess 239 may be formed in a lower position than the surrounding area. The bottom surface 2391 of the second recess 239 may be formed to be longer in a folding axis direction (e.g., the direction F2) than the seating surface 246 of the cushioning member 240. The bottom surface 2391 and sidewalls 2392 and 2393 of the second recess 239 may be formed to have a width corresponding to the seating surface 246 of the cushioning member 240 (e.g., in a direction perpendicular to the folding axis directions F1 and F2). Accordingly, the cushioning member 240 may be constrained in the width direction by the sidewalls 2392 and 2393 and may be movable in the folding axis directions F1 and F2 because the second recess 239 is open in the folding axis direction F2.

Figure 8:
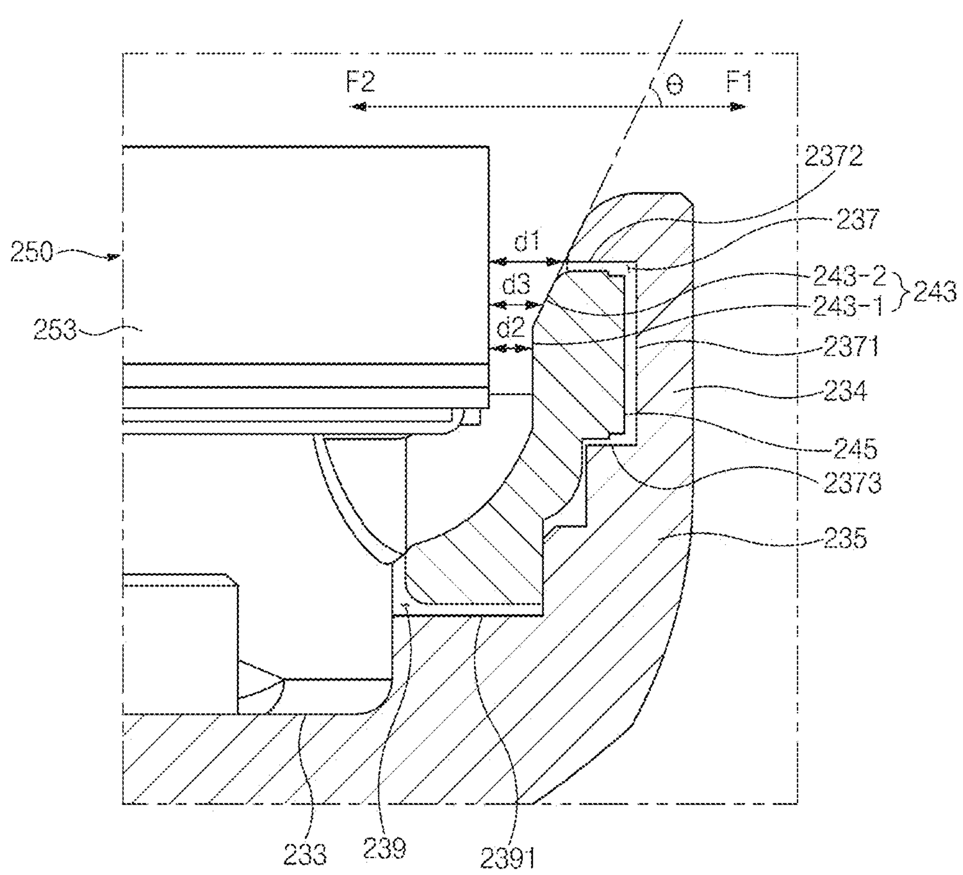
FIG. 8 is a view illustrating a flexible display and the hinge housing of the electronic device according to an embodiment of the disclosure.

FIG. 8 is a view illustrating the flexible display and the hinge housing of the electronic device according to an embodiment of the disclosure. FIG. 8 is a sectional view of the folding axis F of the hinge housing illustrated in FIG. 4A.

Referring to FIG. 8, in the illustrated embodiment, the electronic device 200 may include the flexible display 250 and the hinge housing 230 in which at least a portion of the flexible display 250 is received. In this case, the portion of the flexible display 250 that is received in the hinge housing 230 may be an area (e.g., the folding area 253), the shape of which is able to be deformed depending on a state of the electronic device 200.

The hinge housing 230 may include the inner surface 233 and the sidewall 235 that form the interior space 2332. The sidewall 235 may be formed to face the folding axis direction F2. The sidewall 235 may include the protruding portion 234 facing the flexible display 250. The protruding portion 234 may extend from the sidewall 235 in the direction that the flexible display 250 faces. The protruding portion 234 may include the first recess 237 formed on the surface facing toward the flexible display 250. The first recess 237 may be formed on the surface of the protruding portion 234 and/or the sidewall 235 that faces toward the interior space 2332 of the hinge housing 230. The first recess 237 may be recessed in the folding axis direction F1. The hinge housing 230 may include the second recess 239 formed on a portion of the inner surface 233 adjacent to the sidewall 235. The second recess 239 may be recessed in a direction perpendicular to the folding axis directions F1 and F2. Portions of the cushioning member 240 may be received in the first recess 237 and the second recess 239.

The cushioning member 240 may include the first portion 241 coupled to the sidewall 235 of the hinge housing 230 and the second portion 242 coupled to the inner surface 233 of the hinge housing 230. At least part of the first portion 241 may be received in the first recess 237 of the hinge housing 230. The second portion 242 may be received in the second recess 239 of the hinge housing 230.

The first recess 237 may include a first inner wall 2372 and a second inner wall 2373 that face each other and a first bottom surface 2371 to which the bonding surface 245 of the cushioning member 240 is bonded. At least part of the first portion 241 of the cushioning member 240 may be disposed between the first inner wall 2372 and the second inner wall 2373. The bonding surface 245 of the first portion 241 of the cushioning member 240 may be attached to the first bottom surface 2371 of the first recess 237. The bonding surface 245 of the cushioning member 240 may be bonded to the first bottom surface 2371 by the adhesive member 244. At least part of the second portion 242 of the cushioning member 240 may be seated on the second bottom surface 2391 of the second recess 239. At least part of the second portion 242 of the cushioning member 240 may be hidden by the flexible display 250 when the flexible display 250 is viewed from above. Whether the cushioning member 240 is accurately coupled with the hinge housing 230 may be determined through the seating position of the second portion 242. For example, in the case where the second portion 242 protrudes outside the second bottom surface 2391 (e.g., into the interior space 2332 of the hinge housing 230), it can be seen that the first portion 241 is not firmly coupled. Accordingly, a defect that is likely to occur in an assembly process of the cushioning member 240 may be prevented.

The term "gaps" used herein may refer to distances in the folding axis directions F1 and F2. The protruding portion 234 may be spaced apart from the folding area 253 of the flexible display 250 by at least a first gap d1. The cushioning member 240 may be spaced apart from the folding area 253 of the flexible display 250 by at least a second gap d2.

The first gap d1 may be larger than the second gap d2. In other words, the cushioning member 240 may be disposed closer to the folding area 253 of the flexible display 250 than the protruding portion 234. In the case where external shock is applied to the electronic device 200, the flexible display 250 may move in the folding axis direction F1 (e.g., the direction toward the protruding portion 234), and the periphery of the flexible display 250 may collide with the opposite surface 243 of the cushioning member 240.

When the flexible display 250 is viewed from above, the cushioning member 240 may further protrude toward the flexible display 250 beyond the protruding portion 234. This structure may prevent the flexible display 250 from directly colliding with the protruding portion 234, thereby protecting the folding area 253 vulnerable to shock.

A C-Cut structure may be formed on the surface of the protruding portion 234 that faces the folding area 253. The first inner wall 2372, the second inner wall 2373, and the first bottom surface 2371 of the first recess 237, which have been described above, may form the C-Cut structure. The C-Cut structure may protect the cushioning member 240 and may reduce the area by which the cushioning member 240 is exposed on the exterior of the electronic device 200.

The cushioning member 240 may include the opposite surface 243 that faces the folding area 253 of the flexible display 250. The opposite surface 243 may include the first area 243-1 substantially facing the folding axis direction F2 and the second area 243-2 that extends from the first area 243-1 and that is inclined to be spaced farther away from the folding area 253. At least a portion of the first inner wall 235 of the protruding portion 234 may have a slope corresponding to a virtual inclined surface extending from the second area 243-2. In various embodiments, the angle θ of the second area 243-2 with respect to the folding axis direction F1 may range from 50 degrees to 80 degrees. The angle θ may preferably be about 66 degrees.

The cushioning member 240 may be partially exposed on the exterior of the electronic device 200 through the space between the flexible display 250 and the protruding portion 234. The slope structure and the C-Cut structure (e.g., the first recess 237), which are illustrated, may reduce the area by which the cushioning member 240 is exposed on the exterior of the electronic device 200, thereby improving an aesthetic impression of the electronic device 200.

The first area 243-1 of the opposite surface 243 may be spaced apart from the folding area 253 by the second gap d2, and the second area 243-2 of the opposite surface 243 may be spaced apart from the folding area 253 by a third gap d3 larger than the second gap d2. In this case, the protruding portion 234 may be spaced apart from the folding area 253 by the first gap d1 larger than the second gap d2.

The smallest gap (e.g., the first gap d1) between the protruding portion 234 and the folding area 253 may be larger than the largest gap (e.g., the third gap d3) between the cushioning member 240 and the folding area 253. In other words, the cushioning member 240 may be disposed closer to the folding area 253 than the protruding portion 234. The cushioning member 240, when viewed in the folding axis directions F1 and F2, may be disposed closer to the folding area 253 than the protruding portion 234.

FIG. 9A is a view illustrating the cushioning member of the electronic device according to an embodiment of the disclosure. FIG. 9B is a view illustrating the cushioning member and the flexible display of the electronic device according to an embodiment of the disclosure. FIG. 9C is a view illustrating the cushioning member and the flexible display of the electronic device according to an embodiment of the disclosure.

Referring to FIG. 9A to 9C, the hinge housing 230 may include the outer surfaces 231 and 232 that form the exterior, the inner surface 233 that forms the interior space 2332, the protruding portion 234 formed in the folding axis direction F, and the cushioning member 240 coupled to the protruding portion 234. The outer surfaces 231 and 232 of the hinge housing 230 may include the first surface 231 facing toward the flexible display 250 in a flat state and the second surface 232 that is opposite to the first surface 231 and that has at least a portion formed to be a curved surface. The cushioning member 240, when viewed in the direction of the folding axis F, may be formed to at least partially overlap the folding area 253 of the flexible display 250.

At least part of the first portion 241 of the cushioning member 240 may be coupled to the protruding portion 234, and at least part of the second portion 242 of the cushioning member 240 may be coupled to the inner surface 233. The first portion 241 may further protrude toward the folding area 253 beyond the opposite surface 243 of the protruding portion 234.

The electronic device 200 may be formed such that the folding area 253 of the flexible display 250 faces a portion of the cushioning member 240 in a folded state. In the folded state, the periphery of the folding area 253 may face the first portion 241 of the cushioning member 240. In the folded state, at least a portion of the first metal layer 254 and at least a portion of the second metal layer 255 may be received in the third recess 2331 formed on the first surface 231 of the hinge housing 230. The third recess 2331 may be recessed toward the inner surface 233 from the first surface 231.

The electronic device 200 may be formed such that the folding area 253 of the flexible display 250 faces a portion of the cushioning member 240 in a flat state. In the flat state, the flexible display 250 may be disposed such that at least portions of the peripheries of the first area 251, the second area 252, the first metal layer 254, and the second metal layer 255 face the first portion 241 of the cushioning member 240.

In the illustrated embodiment, when viewed in the folding axis direction F, the flexible display 250 may be disposed such that the folding area 253 overlaps the cushioning member 240. In the folded state, the folding area 253 may be disposed to overlap the first portion 241 of the cushioning member 240. In the flat state, portions of the folding area 253, the first area 251, and the second area 252 may be disposed to overlap the first portion 241 of the cushioning member 240.

The protruding portion 234 may be formed of a rigid metallic material. The cushioning member 240 may contain a shock-absorbing material capable of absorbing shock.

Figures 10A, 10B, 10C:
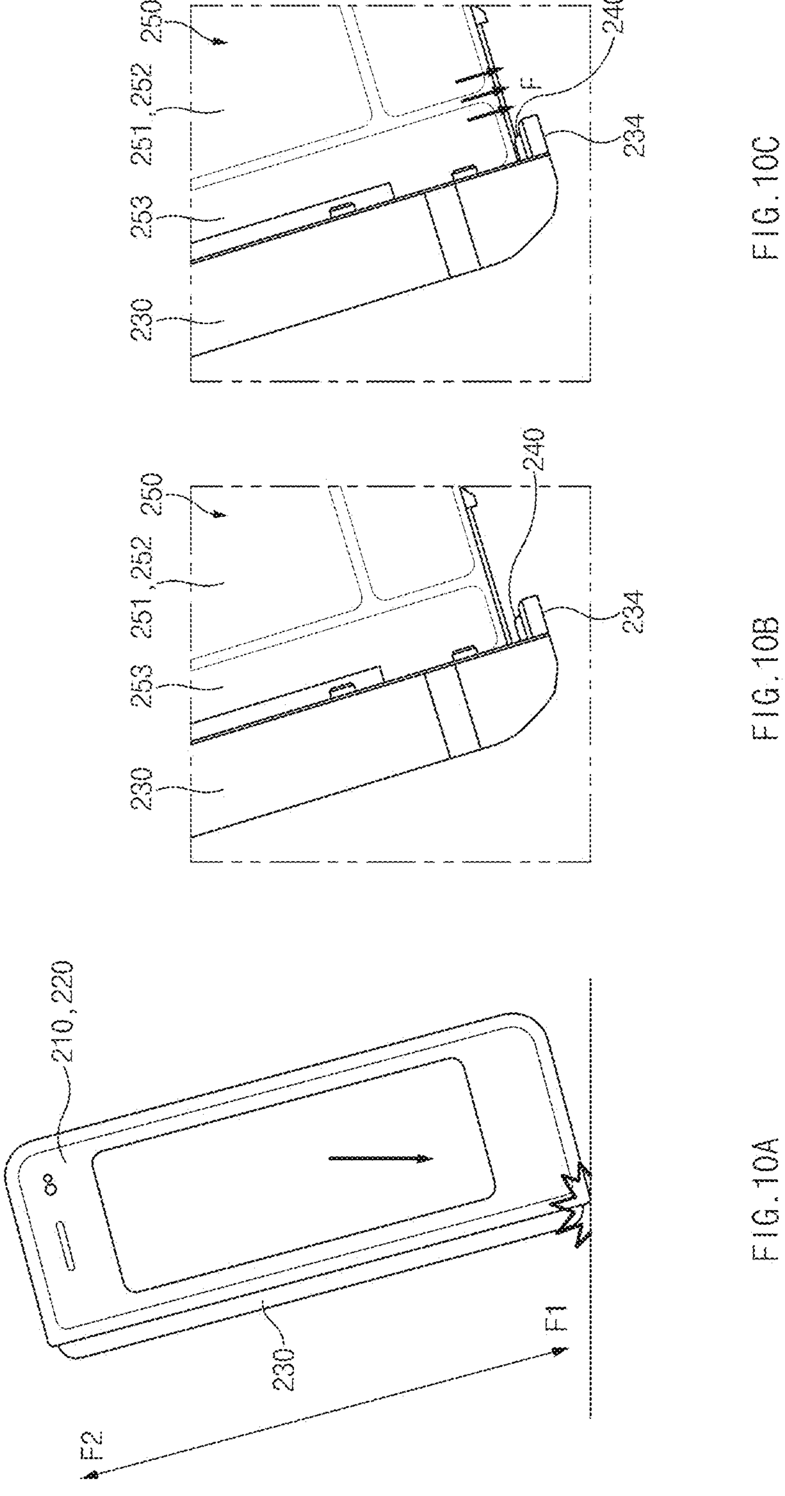
FIGS. 10A, 10B, and 10C are views illustrating the flexible display and the cushioning member in the case where the electronic device according to various embodiments of the disclosure.

FIGS. 10A to 10C are views illustrating the flexible display and the cushioning member in the case where the electronic device is dropped, according to various embodiments of the disclosure.

Figure 11:
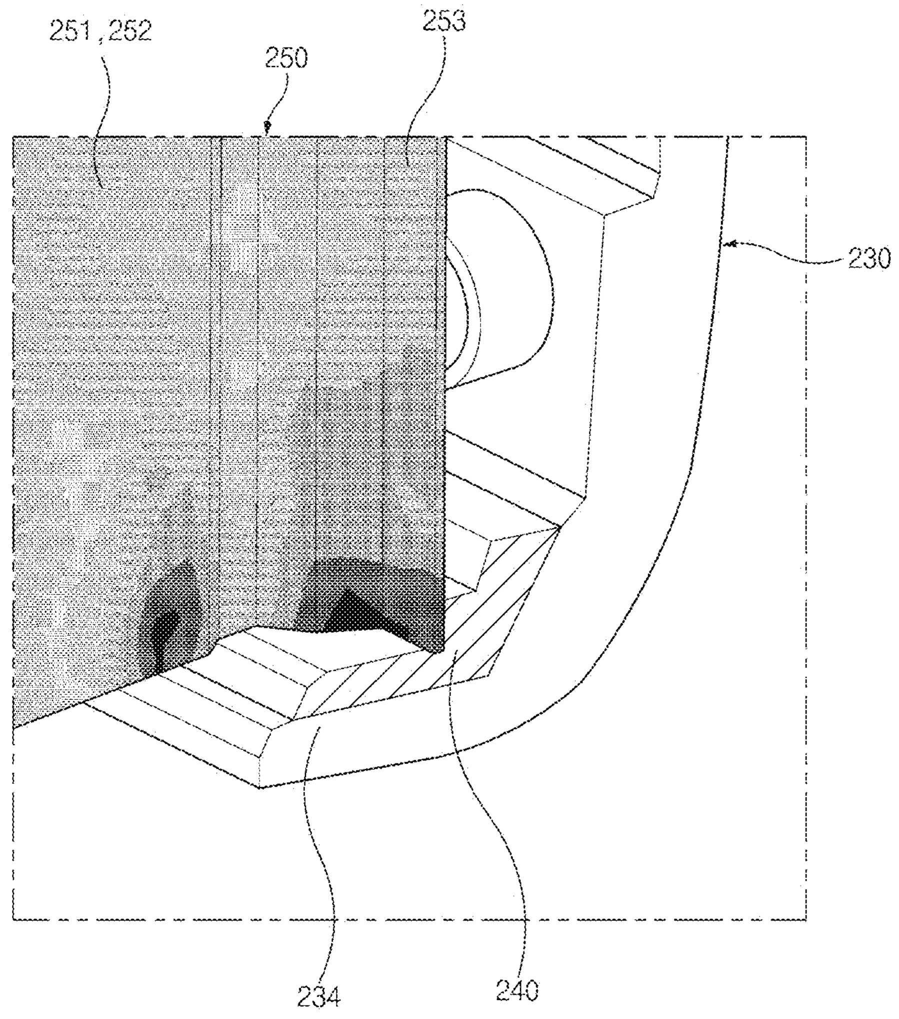
FIG. 11 is a view illustrating a drop impact applied to the flexible display of the electronic device according to an embodiment of the disclosure.

FIG. 11 is a view illustrating a drop impact applied to the flexible display of the electronic device according to an embodiment of the disclosure.

Referring to FIGS. 10A-10C and 11, in the illustrated embodiment, the flexible display 250 may be disposed so as to be movable by a certain range in the folding axis direction F inside the electronic device 200 (e.g., inside the first housing 210 and inside the second housing 220). This is intended to relieve shear stress that is likely to be generated between the rear surface of the flexible display 250 and the inside of the housing (e.g., the first support member 161 and the second support member 162 of FIG. 3), and the flexible display 250 may be attached so as to be movable in a predetermined range inside the housing (e.g., the first support member 161 and the second support member 162 of FIG. 3).

The center of gravity of the electronic device 200 including the flexible display 250 may be formed on an end portion of the hinge housing 230 in the folding axis direction F. Accordingly, in the case where the electronic device 200 drops in a folded state, a drop impact may be applied to the end portion (e.g., the protruding portion) of the hinge housing 230.

Referring to FIGS. 10A to 10C, the folding area 253 of the flexible display 250 coupled to the housings 210 and 220 so as to be movable may move toward the protruding portion 234 by inertia.

Referring to FIG. 11, the cushioning member 240 may be formed to protrude toward the folding area 253 so as to prevent the folding area 253 from directly colliding with the protruding portion 234. The cushioning member 240 may absorb shock applied to the folding area 253, thereby protecting the foldable display 250 from a drop impact.

The folding area 253 of the flexible display 250 may be more vulnerable to shock than other areas (e.g., the first area 251 and the second area 252). The folding area 253 may be an area formed when a plurality of layers included in the flexible display 250 are bent in a folded state. Shear stress may be formed depending on the difference in radius of curvature between the plurality of layers included in the folding area 253. For this reason, the folding area 253 may be more vulnerable to shock than other areas (e.g., the first area 251 and the second area 252). Accordingly, the electronic device 200 disclosed herein may include the cushioning member 240 further protruding toward the folding area 253 and may prevent the folding area 253 from directly colliding with the protruding portion 234.

The electronic device 200 disclosed herein may include the cushioning member 240 formed between the hinge housing 230 containing a metallic material and the folding area 253 of the flexible display 250.

Referring to FIG. 11, shock applied to the folding area 253 may be weaker when the folding area 253 makes contact with the cushioning member 240 than when the folding area 253 makes contact with the protruding portion 234. It can be understood that the cushioning member 240 absorbs part of the shock.

The shock-relieving structure including the cushioning member 240 disclosed herein is not necessarily limited to being applied to the foldable electronic devices 100 and 200 illustrated in FIGS. 1 to 10C. For example, the shock-relieving structure may be applied to an electronic device including a rollable display containing a rolling area in at least a portion thereof or a foldable electronic device (e.g., an out-folding electronic device shown in FIG. 15A) that forms the exterior of the electronic device in a folded state. The shock-relieving structure disclosed herein may be applied to various electronic devices including a display, at least a portion of which is formed to be a curved surface.

Figure 12A:
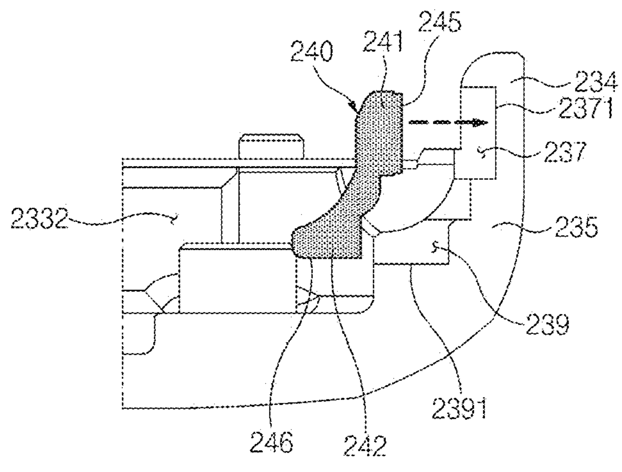
FIGS. 12A, 12B, and 12C are views illustrating assembly of the cushioning member and the hinge housing of the electronic device according to various embodiments of the disclosure.
Figure 12B:
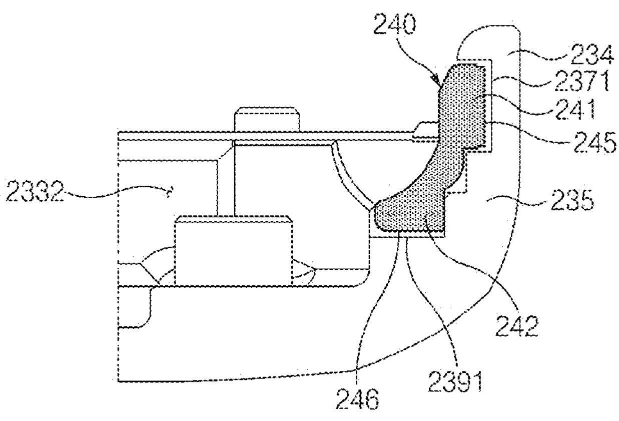
Figure 12C:
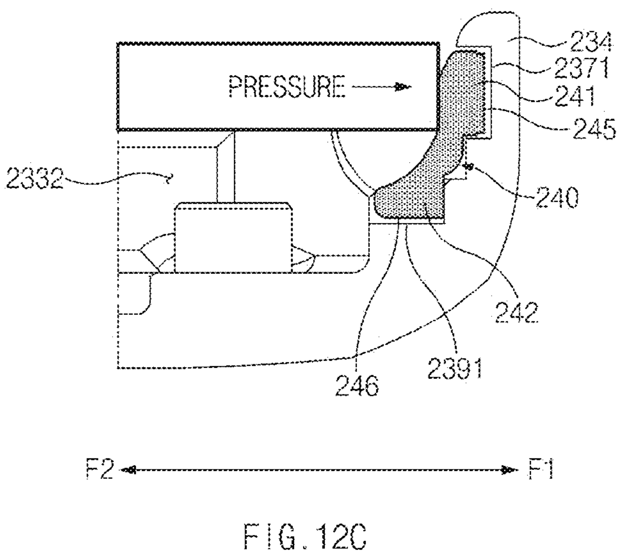

FIGS. 12A to 12C are views illustrating assembly of the cushioning member and the hinge housing of the electronic device according to various embodiments of the disclosure.

Referring to FIGS. 12A to 12C, the cushioning member 240 may be coupled to the protruding portion 234 such that the first portion 241 is received in the first recess 237 and the second portion 242 is received in the second recess 239. The bonding surface 245 of the first portion 241 may be attached to the first bottom surface 2371 of the first recess 237 by the adhesive member 244. The seating surface 246 of the second portion 242 may be seated on the second bottom surface 2391 of the second recess 239. The seating surface 246 may be formed such that the length in the folding axis directions F1 and F2 corresponds to the length of the second bottom surface 2391 in the folding axis directions F1 and F2. This may be used as an indicator for determining whether the cushioning member 240 is accurately coupled to the protruding portion 234 in an assembly process of the cushioning member 240. For example, in the case where the seating surface 246 protrudes outside the second bottom surface 2391 of the second recess 239 (e.g., in the direction toward the interior space 2332), it may be determined that the cushioning member 240 is not accurately coupled to the protruding portion 234.

Referring to FIGS. 12A to 12C, the cushioning member 240 may be slidably coupled to the protruding portion 234 such that the first portion 241 is inserted into the first recess 237 formed on the protruding portion 234 and the second portion 242 is inserted into the second recess 239. The sliding direction of the cushioning member 240 may be the folding axis direction F1. Correspondingly, the second recess 239 may be open in the direction (e.g., F2) opposite to the sliding direction. An additional compression process may be performed on the cushioning member 240 to firmly couple the cushioning member 240 to the protruding portion 234. At this time, the compression direction of the cushioning member 240 may be a direction (e.g., F1) parallel with the sliding direction.

Figure 13A:
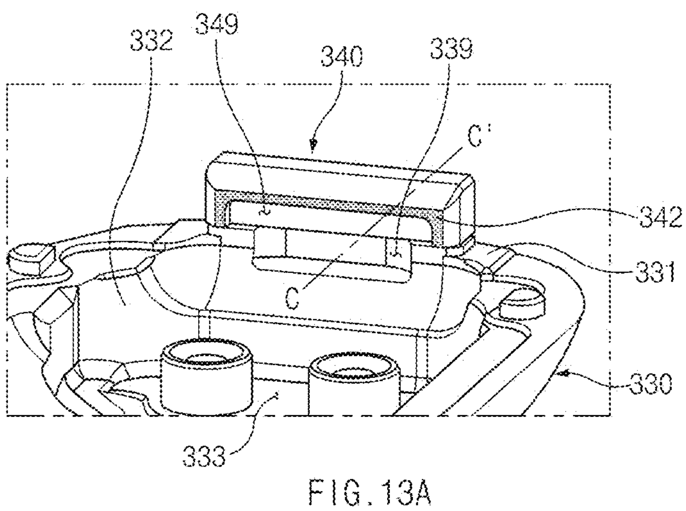
FIGS. 13A, 13B, and 13C are views illustrating a cushioning member and a hinge housing of an electronic device according to various embodiments of the disclosure.
Figure 13B:
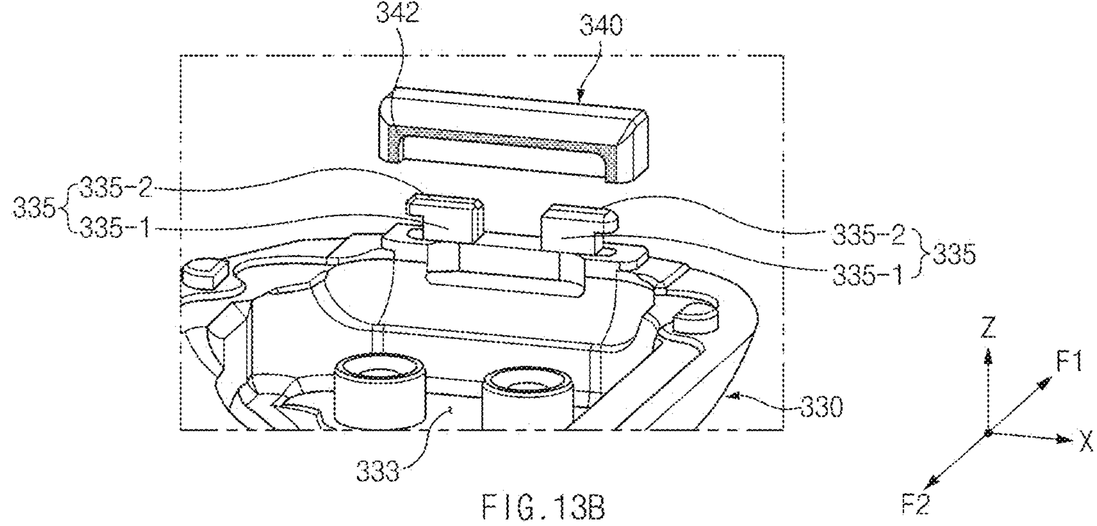
Figure 13C:
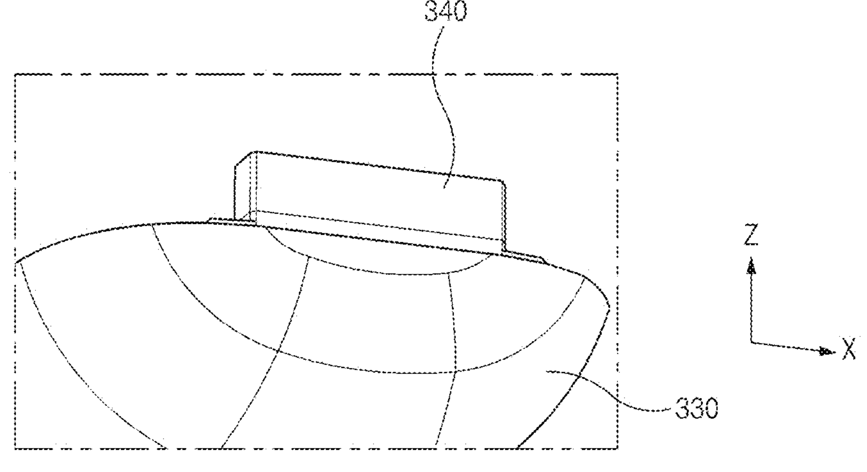

FIGS. 13A to 13C are views illustrating a cushioning member and a hinge housing of an electronic device according to various embodiments of the disclosure.

Referring to FIGS. 13A to 13C, the electronic device may include the hinge housing 330 and the cushioning member 340 coupled to the hinge housing 330.

In the illustrated embodiment, the hinge housing 330 may include a sidewall 331 formed at one end in a rotational axis direction (e.g., F1), an inner surface 332 that forms an interior space 333 together with the sidewall 331, and one or more coupling protrusions 335 formed on the sidewall 331.

The cushioning member 340 may be coupled to the coupling protrusions 335. The coupling protrusions 335 may protrude from the sidewall 331 of the hinge housing 330 in the +z-axis direction. Each of the coupling protrusions 335 may include a first portion 335-1 extending in the +z-axis direction and a second portion 335-2 extending from the first portion 335-1 in a direction perpendicular to the z-axis. For example, the second portion 335-2 may extend from the first portion 335-1 in a folding axis direction F1 or F2, or may extend from the first portion 335-1 in the x-axis direction as illustrated in the drawings.

The cushioning member 340 may be coupled to the coupling protrusions 335 formed on the hinge housing 330. The cushioning member 340 may include an opposite surface 342 substantially facing toward the interior space 333 of the hinge housing 330. In the case where the cushioning member 340 is coupled to the hinge housing 330, the opposite surface 342 may be a surface extending from the sidewall 331 of the hinge housing 330. The cushioning member 340 may include a second recess 349 formed on the opposite surface 342. The second recess 349 may be connected with a first recess 339 formed on the hinge housing 330. The second recess 349 of the cushioning member 340 may be open in the direction toward the sidewall 331 of the hinge housing 330, and the first recess 339 of the hinge housing 330 may be open in the direction toward the cushioning member 340. In the state in which the cushioning member 340 is coupled to the hinge housing 330, the first recess 339 and the second recess 349 may be connected with each other in the open directions. The cushioning member 340 may contain a cushioning material capable of absorbing shock.

Figure 14:
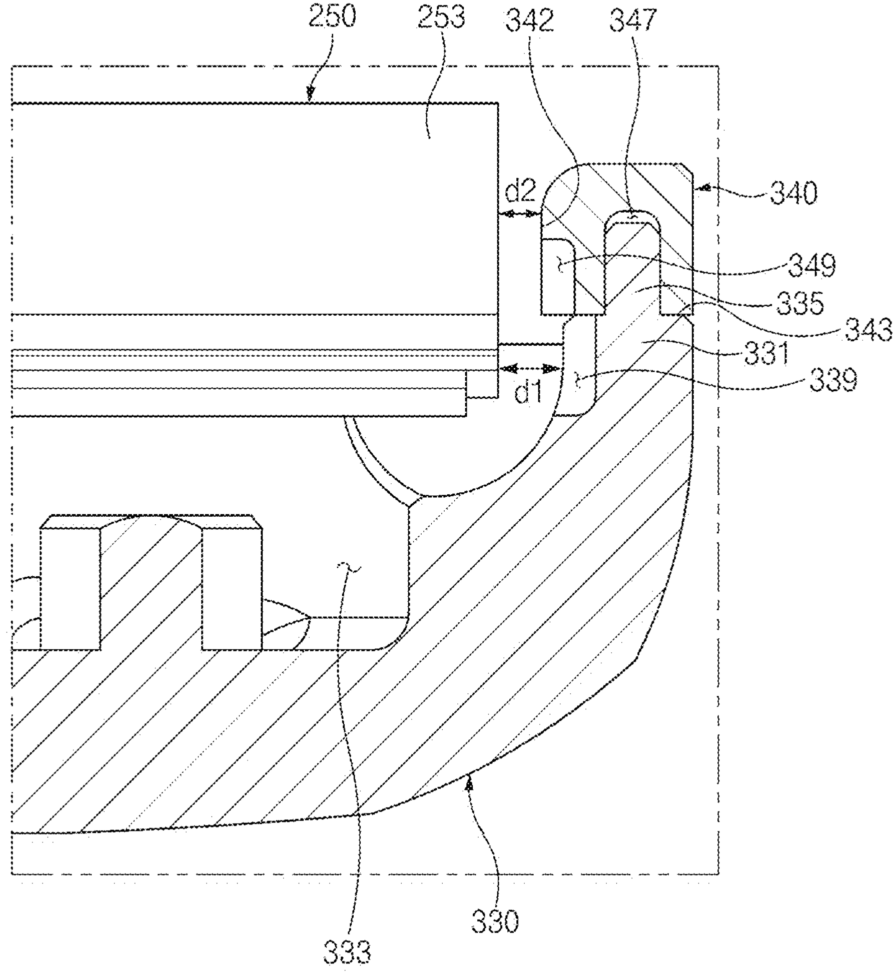
FIG. 14 is a view illustrating the cushioning member and the hinge housing of the electronic device according to an embodiment of the disclosure.

FIG. 14 is a view illustrating the hinge housing and the cushioning member of the electronic device according to an embodiment of the disclosure. FIG. 14 is a sectional view taken along line C-C' illustrated in FIG. 13A.

Referring to FIG. 14, the flexible display 250 may be disposed such that the edge of the folding area 253 faces the sidewall 331 of the hinge housing 330 and the opposite surface 342 of the cushioning member 340. The folding area 253 of the flexible display 250 may be spaced apart from the sidewall 331 of the hinge housing 330 and the opposite surface 342 of the cushioning member 340 by certain gaps. For example, the folding area 253 may be spaced apart from the sidewall 331 of the hinge housing 330 by a first gap d1, and the folding area 253 may be spaced apart from the opposite surface 342 of the cushioning member 340 by a second gap d2 smaller than the first gap d1.

The cushioning member 340 may further protrude in the direction (e.g., the direction F2) toward the interior space 333 of the hinge housing 330 beyond the sidewall 331 of the hinge housing 330. Accordingly, in the case where the flexible display 250 is moved in the folding axis direction F1 by external shock, the edge of the folding area 253 may collide with the cushioning member 340, and the shock applied to the flexible display 250 may be absorbed by the cushioning member 340.

The first recess 339 formed on the sidewall 331 of the hinge housing 330 and the second recess 349 formed on the opposite surface 342 of the cushioning member 340 may be connected to form one recess.

The cushioning member 340 may include a support surface 343 facing the sidewall 331. An opening 347 into which the coupling protrusion 335 of the hinge housing 330 is inserted may be formed on the support surface 343. The opening 347 may be recessed from the support surface 343 of the cushioning member 340 in the +z-axis direction.

The opening 347 of the cushioning member 340 may be formed to be smaller than the coupling protrusion 335 such that the coupling protrusion 335 is press-fit into the opening 347. For example, the diameter of the opening 347 may be smaller than the diameter of a portion (e.g., the second portion 335-2 of FIG. 13B) of the coupling protrusion 335. For example, a second portion (e.g., the second portion 335-2 of FIG. 13B) of the coupling protrusion 335 may be press-fit into the opening 347.

Figure 15A:
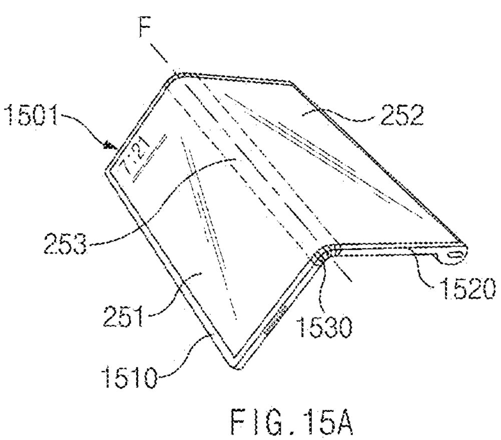
FIGS. 15A, 15B, and 15C are views illustrating shock-relieving structures of foldable electronic devices according to various embodiments of the disclosure.
Figure 15B:
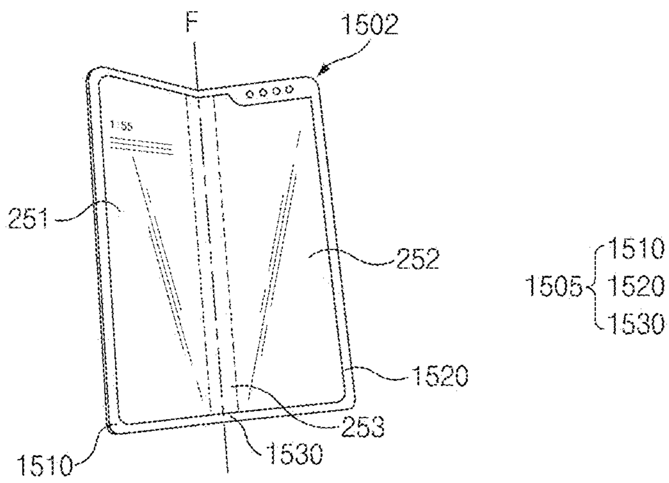
Figure 15C:
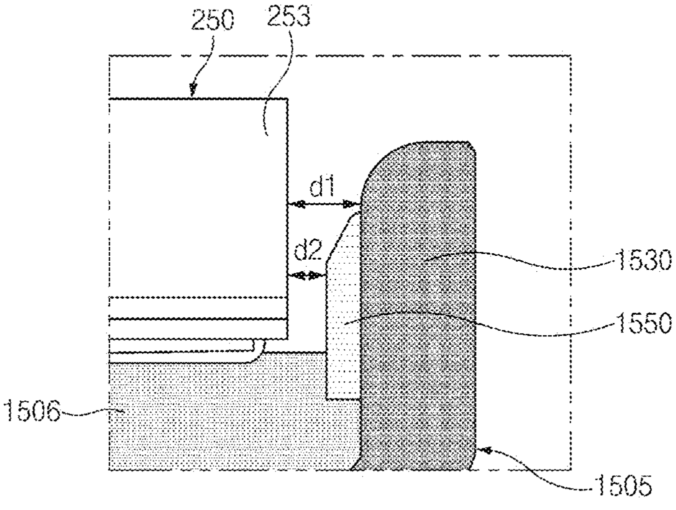

FIGS. 15A to 15C are views illustrating shock-relieving structures of foldable electronic devices according to various embodiments of the disclosure.

FIG. 15A is a view illustrating an out-folding type foldable electronic device 1501 according to an embodiment of the disclosure. FIG. 15B is a view illustrating an in-folding type foldable electronic device 1502 (e.g., the electronic device 100 of FIGS. 1 to 3) according to an embodiment of the disclosure. FIG. 15C is a sectional view of a folding axis F of each of the foldable electronic devices illustrated in FIGS. 15A and 15B according to an embodiment of the disclosure.

Referring to FIGS. 15A-15C, the out-folding type foldable electronic device 1501 may include an electronic device in which the flexible display 250 forms the exterior of the foldable electronic device in a folded state.

The foldable electronic devices 1501 and 1502 may include a housing structure that includes a plate structure 1506 on which the flexible display 250 is seated and a frame structure 1505 that surrounds at least a portion of the periphery of the flexible display 250. The frame structure 1505 may surround the plate structure 1506. The frame structure 1505 and the plate structure 1506 may be integrated with each other, or may be assembled as separate members.

The plate structure 1506 may be referred to as the support member assembly 160 illustrated in FIG. 3. The frame structure 1505 may be referred to as the first side member 113 and the second side member 123 illustrated in FIG. 1.

The flexible display 250 may be attached to the plate structure 1506 so as to be movable in a certain range. For example, the flexible display 250 may be attached to the plate structure 1506 by a double-sided tape, but may be minutely moved in the certain range in the direction of the folding axis F.

The frame structure 1505 may include a first frame structure 1510 surrounding at least a portion of the first area 251, a second frame structure 1520 surrounding at least a portion of the second area 252, and a third frame structure 1530 surrounding at least a portion of the folding area 253. The third frame structure 1530 may include the protruding portion 234 described above with reference to FIGS. 5A to 12C.

The frame structure 1505 may include a shock-relieving structure on at least a portion thereof. The shock-relieving structure may be formed in a position corresponding to the folding area 253 of the flexible display 250. The shock-relieving structure may include a shock-absorbing member 1550 (e.g., the cushioning member 240 of FIGS. 5A to 12C) that protrudes toward the flexible display 250. The shock-absorbing member 1550 may be formed closer to the periphery of the flexible display 250 than other portions of the frame structure 1505.

Referring to FIG. 15C, the third frame structure 1530 may be spaced apart from the flexible display 250 by a first gap d1, and the shock-absorbing member 1550 may be spaced apart from the flexible display 250 by a second gap d2. Accordingly, the folding area 253 relatively vulnerable to shock may be prevented from directly colliding with the frame structure 1505 formed of a metallic material. In various embodiments, the shock-absorbing member 1550 may be integrally formed with the frame structure 1505. For example, the shock-absorbing member 1550 may include an injection-molded part on a portion of the frame structure 1505 formed of a metallic material.

The shock-relieving structure disclosed herein may be applied to various electronic devices including the flexible display 250 that includes an area that is able to be deformed (into a flat surface or a curved surface) irrespective of the direction in which the flexible display 250 is folded (e.g., in-folding 1501, out-folding 1502, and double-folding (not illustrated)).

Figure 16:
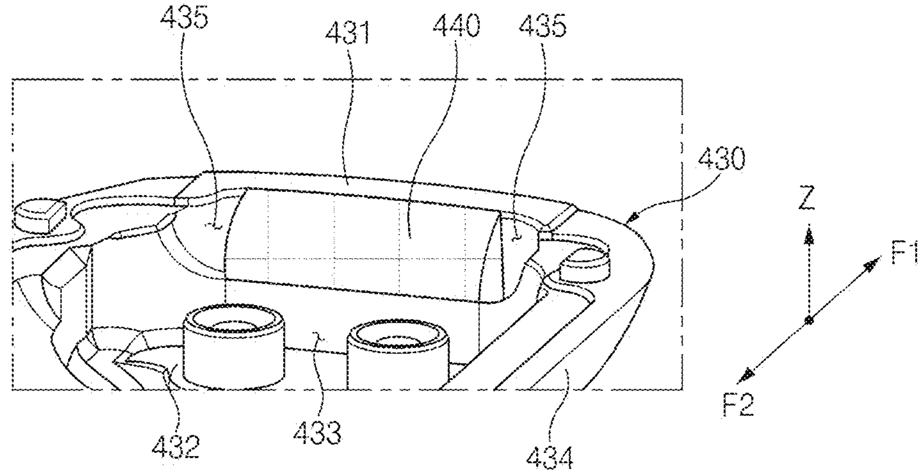
FIG. 16 is a view illustrating a cushioning member and a hinge housing of an electronic device according to an embodiment of the disclosure.

FIG. 16 is a view illustrating a hinge housing and a cushioning member of an electronic device according to an embodiment of the disclosure.

Referring to FIG. 16, in the illustrated embodiment, the hinge housing 430 may include a sidewall 431 to which the cushioning member 440 is coupled, an inner surface 432 that forms an interior space 433 of the hinge housing 430 together with the sidewall 431, and an outer surface 434 that forms the exterior of the electronic device. At least a portion of the sidewall 431 may face folding axis directions F1 and F2. The cushioning member 440 may be disposed on the inside of the sidewall 431.

In the illustrated embodiment, at least a portion of the cushioning member 440 may be formed on the inside of the sidewall 431 to face toward the interior space 433 of the hinge housing 430. Unlike in the other embodiments described above, the hinge housing 430 illustrated in FIG. 16 may omit a protruding structure (e.g., the protruding portion 234 of FIGS. 5A to 14 or the coupling protrusion 335 of FIG. 13B) that is formed on the sidewall 431.

The cushioning member 440 may further protrude toward the interior space 433 of the hinge housing 430 beyond the sidewall 431 of the hinge housing 430.

A portion of the cushioning member 440 may be received in a recess 435 formed on the sidewall 431 of the hinge housing 430. The remaining portion of the cushioning member 440 may further protrude toward the interior space 433 of the hinge housing 430 beyond a peripheral portion of the recess 435. Accordingly, a flexible display (e.g., the folding area 253 of the flexible display 250 of FIG. 14) may be prevented from being damaged by directly colliding with the sidewall 431.

In some embodiments (not illustrated), at least a portion of the cushioning member 440 may be located in the interior space 433 of the hinge housing 430, and the remaining portion of the cushioning member 440 may extend outside the interior space 433 (e.g., in the +z-axis direction).

According to embodiments of the disclosure, an electronic device may include a hinge housing 230 extending in a direction of a folding axis F, a first housing 210 connected to one side of the hinge housing 230 in a direction perpendicular to the folding axis F to rotate about the folding axis F relative to the hinge housing 230, a second housing 220 connected to an opposite side of the hinge housing 230 in a direction perpendicular to the folding axis F to rotate about the folding axis F relative to the hinge housing 230, and a flexible display 250 including a folding area 253 at least partially disposed in the hinge housing 230 and formed to be a flat surface or a curved surface, a first area 251 extending from the folding area 253 in one direction perpendicular to the folding axis F, and a second area 252 extending from the folding area 253 in an opposite direction perpendicular to the folding axis F, and the hinge housing 230 may include protruding portions 234 formed on opposite end portions of the hinge housing in the direction of the folding axis F and adjacent to a periphery of the flexible display 250 and cushioning members 240 disposed between the protruding portions 234 and the periphery of the flexible display 250 and spaced apart from the periphery of the flexible display 250 by a certain gap.

Each of the protruding portions 234 may include a first protruding portion 234-1 located on one side with respect to the direction of the folding axis F and a second protruding portion 234-2 located on an opposite side with respect to the direction of the folding axis F, and each of the cushioning members 240 may include a first cushioning member 240-1 formed between the first protruding portion 234-1 and an edge of the folding area 253 and a second cushioning member 240-2 formed between the second protruding portion 234-2 and the edge of the folding area 253.

Each of the protruding portions 234 may be spaced apart from an edge of the folding area 253 of the flexible display 250 by a first gap d1, and each of the cushioning members 240 may be spaced apart from the edge of the folding area 253 of the flexible display 250 by a second gap d2 smaller than the first gap.

Each of the protruding portions 234 may include a first recess 237 formed on a surface facing an edge of the folding area 253, and each of the cushioning members 240 may be at least partially received in the first recess 237.

Each of the cushioning members 240 may be formed to overlap a portion of the folding area 253 when the flexible display 250 is viewed in the direction of the folding axis F.

Each of the cushioning members 240 may include a first portion facing an edge of the folding area 253 of the flexible display 250 and a second portion extending from the first portion toward a space between the flexible display 250 and the hinge housing 230.

The second portion may be formed to be at least partially hidden by the flexible display 250 when the hinge housing 230 is viewed from above.

The hinge housing 230 may include an inner surface 233 facing a rear surface of the folding area 253 of the flexible display 250 and a sidewall 235 extending from the inner surface 233 and including an area facing the direction of the folding axis F, each of the protruding portions 234 may protrude from the sidewall 235 toward a front surface of the flexible display 250, and a portion of each of the cushioning members 240 may be coupled to the protruding portion 234, and the remaining portion of the cushioning member extends to the inner surface.

The inner surface may include a second recess 239 in which at least a portion of the cushioning member 240 is received, and the second recess 239 may be open in the direction of the folding axis F.

Each of the cushioning members 240 may include a first portion including a bonding surface 245 attached to each of the protruding portions 234 and an opposite surface 234 opposite to the bonding surface 245 and facing the folding area 253 and a second portion including a seating surface 246 that is seated on an inner surface of the hinge housing 230. The cushioning member 240 may be coupled with the hinge housing 230 such that the bonding surface 245 is attached to a first bottom surface of a first recess formed on the protruding portion 234 and the seating surface 246 is located on a second bottom surface 2391 of a second recess 239 formed on the inner surface of the hinge housing 230.

The opposite surface 243 may include a first area 251 facing the direction of the folding axis F and a second area 252 that extends from the first area 251 and that forms a certain angle with the folding axis F, and the second area 252 may include an inclined surface that is inclined to be spaced farther away from the folding area 253 with an increasing distance from the first area 251.

The certain angle may range from 50 degrees to 80 degrees.

The first recess 237 may include the first bottom surface 2371 facing toward an edge of the folding area 235, a first sidewall 2372 extending from the first bottom surface 2371 and facing toward the inner surface of the hinge housing 230, and a second sidewall 2373 opposite to the first sidewall 2372, at least part of the first portion of the cushioning member 240 may be disposed between the first sidewall 2372 and the second sidewall 2373, and the first sidewall 2372 may be formed to form a virtual inclined surface extending from the inclined surface of the opposite surface 243.

An electronic device according to embodiments of the disclosure may include a housing structure including a first housing 210, a second housing 220, and a hinge housing 430 disposed between the first housing 210 and the second housing 220, in which the first housing 210 and the second housing 220 are configured to be folded toward each other about a folding axis F aligned with the hinge housing 430, a flexible display 250 including a folding area 253 at least partially disposed in the hinge housing 430 and formed to be a flat surface or a curved surface, a first area 251 that extends from the folding area 253 and that is disposed in the first housing 210, and a second area 252 that extends from the folding area 253 and that is disposed in the second housing 220, and a shock-relieving structure that absorbs shock applied to the flexible display 250. The hinge housing 430 may include a sidewall, at least a portion of which faces a direction of the folding axis F. The shock-relieving structure may include a shock-absorbing member 440 formed between the sidewall and a periphery of the flexible display 250.

The hinge housing 430 may be formed such that the sidewall is spaced apart from the periphery of the flexible display 250 by a first gap and the cushioning member 440 is spaced apart from the periphery of the flexible display 250 by a second gap smaller than the first gap, and the cushioning member 440 may be at least partially located in an interior space 433 of the hinge housing 430.

The sidewall 431 may include a first sidewall 235-1 formed on one side with respect to the direction of the folding axis F and a second sidewall 235-2 formed on an opposite side with respect to the direction of the folding axis F, the cushioning member 440 may include a first cushioning member 240-1 formed between the first sidewall 235-1 and the periphery of the flexible display 250 and a second cushioning member 240-2 formed between the second sidewall 235-2 and the periphery of the flexible display 250, and the folding area 235 of the flexible display 250 may be disposed between the first cushioning member 240 and the second cushioning member 240.

An electronic device according to embodiments of the disclosure may include a flexible display 250 including a first area 251 formed to be a flat surface, a second area 252 formed to be a flat surface, and a folding area 253 formed between the first area 251 and the second area 252 and formed to be a flat surface or a curved surface, a housing structure that surrounds a periphery of the flexible display 250 and that includes a frame structure 1505 spaced apart from the periphery by a first gap, and a shock-relieving structure including a shock-absorbing member 1550 formed between the frame structure 1505 and the periphery of the flexible display 250 and spaced apart from the periphery by a second gap smaller than the first gap.

The frame structure 1505 may include a first frame structure 1510 that surrounds at least a portion of the first area 251, a second frame structure 1520 that surrounds at least a portion of the second area 252, and a third frame structure 1530 that surrounds at least a portion of the folding area 253, and the shock-relieving structure may be formed in the third frame structure 1530.

The housing structure may further include a plate structure 1506 on which the frame structure 1505 is formed and on which a rear surface of the flexible display 250 is seated, the shock-relieving structure may include a first shock-relieving structure disposed adjacent to a first edge of the flexible display and a second shock-relieving structure disposed adjacent to a second edge of the flexible display that faces the first edge of the flexible display in a direction of a folding axis, a rear surface of the first area 251 and a rear surface of the second area 252 may be coupled to the plate structure 1506 such that the flexible display 250 is movable relative to the plate structure 1506 in a certain range in the direction of the folding axis F, and the certain range may be greater than or equal to the second gap.

The shock-relieving structure may be integrally formed with the frame structure 1505.

According to the embodiments of the disclosure, the gap between the flexible display and the housing structure may be reduced. Furthermore, foreign matter may be prevented from infiltrating into the housing structure through the gap.

According to the embodiments of the disclosure, the flexible display may be prevented from directly colliding with the rigid housing structure. Accordingly, a risk of deviation in an assembly process of the flexible display may be reduced.

In addition, the disclosure may provide various effects that are directly or indirectly recognized.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as “A or B,” “at least one of A and B,” “at least one of A or B,” “A, B, or C,” “at least one of A, B, and C,” and “at least one of A, B, or C,” may include any one of, or all possible combinations of the items enumerated together in a corresponding one of the phrases. As used herein, such terms as “1st” and “2nd,” or “first” and “second” may be used to simply distinguish a corresponding component from another, and does not limit the components in other aspect (e.g., importance or order). It is to be understood that if an element (e.g., a first element) is referred to, with or without the term “operatively” or “communicatively”, as “coupled with,” “coupled to,” “connected with,” or “connected to” another element (e.g., a second element), it means that the element may be coupled with the other element directly (e.g., wiredly), wirelessly, or via a third element.

As used herein, the term “module” may include a unit implemented in hardware, software, or firmware, and may interchangeably be used with other terms, for example, “logic,” “logic block,” “part,” or “circuitry”. A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program) including one or more instructions that are stored in a storage medium (e.g., internal memory or external memory) that is readable by a machine (e.g., the electronic device). For example, a processor (e.g., the processor) of the machine (e.g., the electronic device) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term “non-transitory” simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer’s server, a server of the application store, or a relay server.

According to various embodiments of the disclosure, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising: a first housing;

a second housing;

a hinge structure with which the first housing and the second housing are pivotably connected to be folded or unfolded relative to each other;

a flexible display including:

a first area disposed in the first housing, a second area disposed in the second housing, and a folding area between the first area and the second area and configured to be deformed depending on the first housing and the second housing being folded or unfolded;

a hinge housing for the hinge structure and being disposed between the first housing and the second housing, the hinge housing having a first sidewall and a second sidewall at opposite ends in a length direction of the hinge housing, the hinge housing including a coupling protrusion formed on each of the sidewalls, each coupling protrusion including a first portion protruding from the respective sidewall in a first direction which is substantially parallel to that sidewall, and a second portion protruding from the first portion in a respective second direction substantially perpendicular to the first direction; and a respective cushioning member coupled to each of the coupling protrusions, wherein the flexible display is disposed such that a portion of each cushioning member faces a corresponding periphery of the folding area.

2. The electronic device of claim 1, wherein each cushioning member is coupled to a respective coupling protrusion such that at least one portion of that cushioning member is exposed between the first housing and the second housing.

3. The electronic device of claim 1, wherein each cushioning member includes a support surface facing a direction opposite the first direction, wherein an opening is formed on the support surface into which the respective coupling protrusion is inserted.

4. The electronic device of claim 1, wherein a surface of each cushioning member is disposed between the second portion of the respective coupling protrusion and the flexible display.

5. The electronic device of claim 4, wherein said surface of each cushioning member extends from the respective sidewall of the hinge housing.

6. The electronic device of claim 1, wherein the first housing is rotatably coupled to one side of the hinge structure about a first axis and the second housing is rotatably coupled to an opposite side of the hinge structure about a second axis parallel to the first axis, and wherein the second direction is substantially parallel to the first axis and the second axis.

7. The electronic device of claim 1, each coupling protrusion including a further second portion protruding from the first portion in a third direction perpendicular to the first direction and opposite to the respective second direction.

8. The electronic device of claim 1, wherein the first housing and the second housing are configured to be folded or unfolded about a folding axis, and wherein the hinge housing extends in a direction of the folding axis, and wherein the second direction is substantially parallel to the folding axis.

9. The electronic device of claim 8, wherein at least a portion of each cushioning member is disposed between the respective coupling protrusion and the periphery of the folding area facing the direction of the folding axis.

10. The electronic device of claim 1, wherein the folding area of the flexible display is disposed between the respective cushioning members.

11. The electronic device of claim 1, wherein at least a portion of each cushioning member is positioned between the respective coupling protrusion and the folding area of the flexible display.

12. The electronic device of claim 11, wherein said portion of each cushioning member is positioned between the first portion of the respective coupling protrusion and the folding area of the flexible display in the folded state and the unfolded state of the first housing and the second housing.

13. The electronic device of claim 1, wherein a portion of each cushioning member remains in contact with at least one of the first portion and the second portion while the first housing and the second housing are folded or unfolded.

14. The electronic device of claim 1, wherein the periphery of the folding area is spaced apart from the first sidewall by a first gap and spaced apart from the cushioning member coupled to the coupling protrusion formed on the first sidewall by a second gap smaller than the first gap, and wherein the periphery of the folding area is spaced apart from the second sidewall by a third gap and spaced apart from the cushioning member coupled to the coupling protrusion formed on the second sidewall by a fourth gap smaller than the third gap.

15. The electronic device of claim 1, wherein at least one portion of each cushioning member is disposed to overlap an exterior surface of a portion of the folding area between the first housing and the second housing.

* * * * *